US011662700B2

(12) United States Patent
Quinn

(10) Patent No.: US 11,662,700 B2
(45) Date of Patent: May 30, 2023

(54) SYSTEM FOR SIMULATING PHYSICAL SYSTEMS OF INTERCONNECTED ELEMENTS

(71) Applicant: AUGMENTED HAPTICS LTD, Northampton (GB)

(72) Inventor: Gregory Quinn, Northants (GB)

(*) Notice: Subject to any disclaimer, the term of this patent is extended or adjusted under 35 U.S.C. 154(b) by 2 days.

(21) Appl. No.: 17/625,743

(22) PCT Filed: Jul. 27, 2020

(86) PCT No.: PCT/AU2020/050765
§ 371 (c)(1),
(2) Date: Jan. 8, 2022

(87) PCT Pub. No.: WO2021/012019
PCT Pub. Date: Jan. 28, 2021

(65) Prior Publication Data
US 2022/0283555 A1 Sep. 8, 2022

(30) Foreign Application Priority Data

Jul. 25, 2019 (AU) .............................. 2019902650

(51) Int. Cl.
*G05B 19/02* (2006.01)
*G06F 3/01* (2006.01)
*G06T 19/00* (2011.01)

(52) U.S. Cl.
CPC .............. *G05B 19/02* (2013.01); *G06F 3/011* (2013.01); *G06T 19/006* (2013.01); *G05B 2219/32014* (2013.01)

(58) Field of Classification Search
CPC .......... G05B 19/02; G05B 2219/32014; G06F 3/011; G06F 30/20; G06F 3/017; G06F 3/0425; G06T 19/006; G06T 19/00; G06T 7/50; G06T 2207/10048; G06T 7/60; A63F 13/213; A63F 13/245; A63F 13/26; A63F 13/5372; A63F 13/57; A63F 13/98; G09B 5/02; G09B 1/02; G09B 19/0069; G06V 20/64
See application file for complete search history.

(56) References Cited

U.S. PATENT DOCUMENTS

2015/0379335 A1* 12/2015 Marlow .................... G06T 7/75
382/203

* cited by examiner

*Primary Examiner* — Ryan R Yang

(57) ABSTRACT

A simulation system comprising: a plurality of physical components, each corresponding to one of a plurality of physical component types, an attachment panel comprising an arrangement of attachment locations, such that one or more of the physical components are attachable to the attachment panel; a display system configured to provide a visualisation on or proximate one or both of the attachment panel and the plurality of physical components; a capture device configured to capture image data of a current status of the attachment panel and the plurality of physical components; and a controller, when at least one physical component is coupled to the attachment panel.

23 Claims, 21 Drawing Sheets

SYSTEM FOR SIMULATING PHYSICAL SYSTEMS OF INTERCONNECTED ELEMENTS

CROSS-REFERENCE TO RELATED APPLICATIONS

This application claims priority to Australian Provisional Patent Application No. 2019902650, titled "Structural modelling system and method" filed on the Australian Patent and Trademark Office on Jul. 25, 2019, and claims priority to Patent Cooperation Treaty (PCT) Application No. PCT/AU2020/050765, titled "System for simulating physical systems of interconnected elements" filed on Jul. 27, 2020. The specification of the above referenced patent application is incorporated herein by reference in its entirety.

BACKGROUND OF THE INVENTION

A. Technical Field

The invention generally relates to a system and method for simulating physical systems of interconnected elements or members. The invention is applicable to the simulation of physical systems in which elements are mechanically coupled to each other, as well as other systems including electrical, mechanical and the like.

B. Description of Related Art

Many digital and physical aids exist for the teaching of science and engineering principals. Physical aids such as sponge blocks or hanging chains can help students develop an intuition for structural behaviour via tactile response whereas computer-based aids can be effective in developing intuition for the distribution of internal forces and can support the teaching of theoretical principals. However, physical aids are limited to set examples of demonstrators (i.e. with limited or no capacity for customisation) e.g. buckling columns, portal frames or sponge blocks meaning that they, the physical aids, do not grant users an exploratory nor design-led experience. Conversely digital tools, which generally adopt either a play-based game or theory-complimenting software model, are typically overly playful or overly complex and always omit the tactile interaction which is known to be so valuable in teaching (and particularly so for mechanical or structural systems whose entire behaviour is defined by deformations).

It would be desirable to provide a digital or physical teaching aid that ameliorates or overcomes one or more of the disadvantages of, or at least provides an alternative to, known teaching aids.

SUMMARY OF THE INVENTION

According to an aspect of the present invention, there is provided a simulation system comprising: a plurality of physical components, each corresponding to one of a plurality of physical component types, an attachment panel comprising an arrangement of attachment locations, such that one or more of the physical components are attachable to the attachment panel; a display system configured to provide a visualisation on or proximate one or both of the attachment panel and the plurality of physical components; a capture device configured to capture image data of a current status of the attachment panel and the plurality of physical components; and a controller configured, when at least one physical component is coupled to the attachment panel, to: determine a configuration of physical components one or more of which are coupled to the attachment panel; create a configuration of virtual components by assigning a virtual component for each physical component of the configuration of physical components; identify a user's physical interaction with the configuration of physical components and determine a corresponding change to behavioural properties of the configuration of virtual components; apply a selected modelling template to the current arrangement of virtual components to generate a visualisation comprising an indication of a physical effect associated with the change to the behavioural properties; and cause the display system to display the visualisation.

Alternatively, the at least one the physical component may be a docking part selected from a set comprising one or more of: a connecting dock, a tile dock and a tracking beacon.

In some versions of the system, step c) comprises identifying a distortion applied to the configuration of physical components and determine a corresponding distortion to the configuration of virtual components, and step d) comprises applying the selected modelling template to the current arrangement of virtual components to generate a visualisation comprising an indication of a physical effect associated with the distortion.

In some versions of the system, the distortion to the configuration of virtual components is determined at least in part according to the controller: receiving image data from the capture device; identifying distortions to the physical components based on analysing the received image data; and assigning an equivalent distortion to each respective virtual component.

In other embodiments, the at least one physical component corresponds to an electrical circuit element. In this case, step c) may comprise identifying a user-selected change to the at least one electrical circuit element and determining a corresponding change to electrical properties of the configuration of virtual components, and step d) may comprise applying the selected modelling template to the current arrangement of virtual components to generate a visualisation comprising an indication of an electrical effect associated with the user-selected change. The change to one or more electrical properties of the configuration of virtual components may be determined at least in part according to the controller: receiving image data from the capture device; determining a current position of an interaction device coupled to the attachment panel; and determining based on the current position of the interaction device the corresponding change to electrical properties of to the configuration of virtual components.

The capture device may comprise an infrared sensor and/or an RGB sensor. The controller may be configured to identify individual physical components coupled to the attachment panel, and to record the determined type for each physical component. The visualisation may be generated in dependence on the component types, shape, and position of the current arrangement of physical components. The attachment locations may comprise recesses shaped such that, when a physical component is attached to an attachment location, it is prevented from rotating with respect to a plane of the attachment surface. The attachment locations may define a periodic rectangular array.

In some versions of the system, the distortion to the configuration of virtual components is determined at least in part according to the controller: receiving image data from the capture device; determining a current position of an interaction device, wherein the interaction device is pressed against one or more physical components to cause a distortion to the configuration of physical components; and determining based on the current position of the interaction device the distortion to the configuration of virtual components.

In some versions of the system, the interaction device is a hand-held device. In other versions of the system, the interaction device is coupled to one or more interconnected support members, one support member being coupled to the attachment panel.

In embodiment, the at least one physical component corresponds to a structural member, and wherein the, or each, physical component is mechanically couplable to at least one other physical component. The at least one physical component may be a linear part selected from a set comprising one or more of: a beam, strut, cable, rod and rope linear part. Alternatively, the at least one physical component may be an anchored part selected from a set comprising one or more of: a pinned anchor, a rigid anchor, a pulley anchor, a tile anchor and a dial anchor. Alternatively, the at least one the physical component may be a joint part selected from a set comprising one or more of: a pinned anchor, a rigid anchor, a pulley anchor, a tile anchor and a dial anchor.

Alternatively, the at least one the physical component may be a docking part selected from a set comprising one or more of: a connecting dock, a tile dock and a tracking beacon.

In some versions of the system, step c) comprises identifying a distortion applied to the configuration of physical components and determine a corresponding distortion to the configuration of virtual components, and step d) comprises applying the selected modelling template to the current arrangement of virtual components to generate a visualisation comprising an indication of a physical effect associated with the distortion.

In some versions of the system, the distortion to the configuration of virtual components is determined at least in part according to the controller: receiving image data from the capture device; identifying distortions to the physical components based on analysing the received image data; and assigning an equivalent distortion to each respective virtual component.

In some versions of the system, the distortion to the configuration of virtual components is determined at least in part according to the controller: receiving image data from the capture device; determining a current position of an interaction device, wherein the interaction device is pressed against one or more physical components to cause a distortion to the configuration of physical components; and determining based on the current position of the interaction device the distortion to the configuration of virtual components.

In some versions of the system, the interaction device is a hand-held device. In other versions of the system, the interaction device is coupled to one or more interconnected support members, one support member being coupled to the attachment panel.

In other embodiments, the at least one physical component corresponds to an electrical circuit element. In this case, step c) may comprise identifying a user-selected change to the at least one electrical circuit element and determining a corresponding change to electrical properties of the configuration of virtual components, and step d) may comprise applying the selected modelling template to the current arrangement of virtual components to generate a visualisation comprising an indication of an electrical effect associated with the user-selected change. The change to one or more electrical properties of the configuration of virtual components may be determined at least in part according to the controller: receiving image data from the capture device; determining a current position of an interaction device coupled to the attachment panel; and determining based on the current position of the interaction device the corresponding change to electrical properties of to the configuration of virtual components.

The capture device may comprise an infrared sensor and/or an RGB sensor. The controller may be configured to identify individual physical components coupled to the attachment panel, and to record the determined type for each physical component. The visualisation may be generated in dependence on the component types, shape, and position of the current arrangement of physical components.

The attachment locations may comprise recesses shaped such that, when a physical component is attached to an attachment location, it is prevented from rotating with respect to a plane of the attachment surface. The attachment locations may define a periodic rectangular array.

Another aspect of the invention provides a method implemented by a controller for generating a visualisation onto one or both of an attachment panel and the plurality of physical components for a simulation, comprising the steps of: identifying a configuration of virtual components based on received image data, wherein the configuration of virtual components corresponds to a configuration of physical components, wherein each physical component is associated with a physical component type, wherein the physical components are arranged coupled to an attachment panel, and wherein the physical components comprise at least one physical component attachable to an attachment location of the attachment panel; identifying a user's physical interaction with the physical configuration of components and determining a corresponding change to behavioural properties of the configuration of virtual components; applying a selected modelling template to the current arrangement of virtual components; generating a visualisation comprising an indication of a physical effect associated with the change to the behavioural properties; and causing the display system to display the visualisation.

Yet another aspect of the invention provides a computer program configured to cause a processor to implement the above-described method when said program is executed by the processor.

As used herein, the word "comprise" or variations such as "comprises" or "comprising" is used in an inclusive sense, i.e. to specify the presence of the stated features but not to preclude the presence or addition of further features in various embodiments of the invention.

BRIEF DESCRIPTION OF DRAWINGS

In order that the invention may be more clearly understood, embodiments will now be described, by way of example, with reference to the accompanying drawing, in which.

DETAILED DESCRIPTION OF EMBODIMENTS

Figure 1:
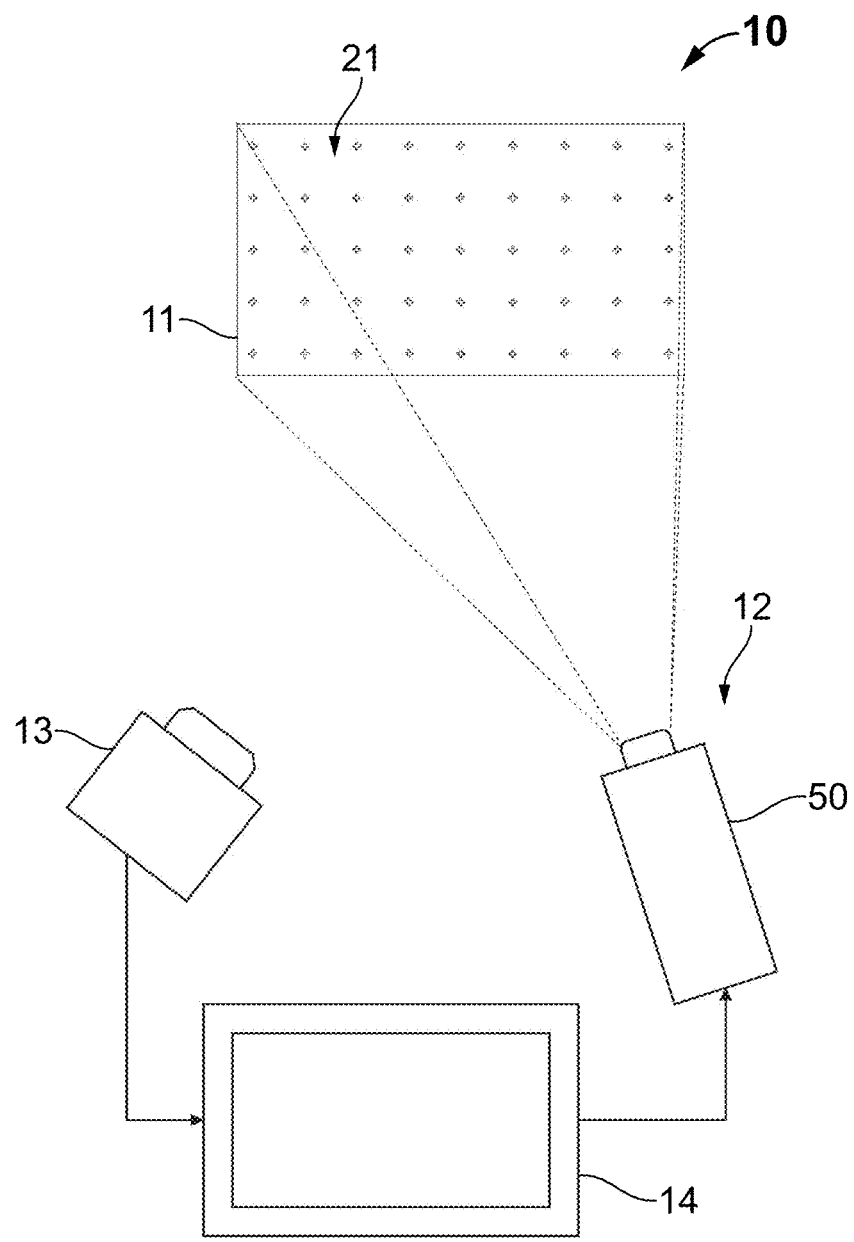
FIG. 1 is a block diagram of a simulation system according to one embodiment of the present invention.

FIG. 1 shows a simulation system 10 for visualising dynamic graphical information onto a structure simulation, according to an embodiment. The system 10 comprises an attachment panel 11, a display system 12, a capture device 13, and a controller 14. The display system 12 and capture device 13 are interfaced with controller 14.

The controller 14 may generally correspond to a programmable computing device. The functionality of the controller 14 is typically defined in software which, when executed by the controller 14, implements the methods herein described.

Figure 2:
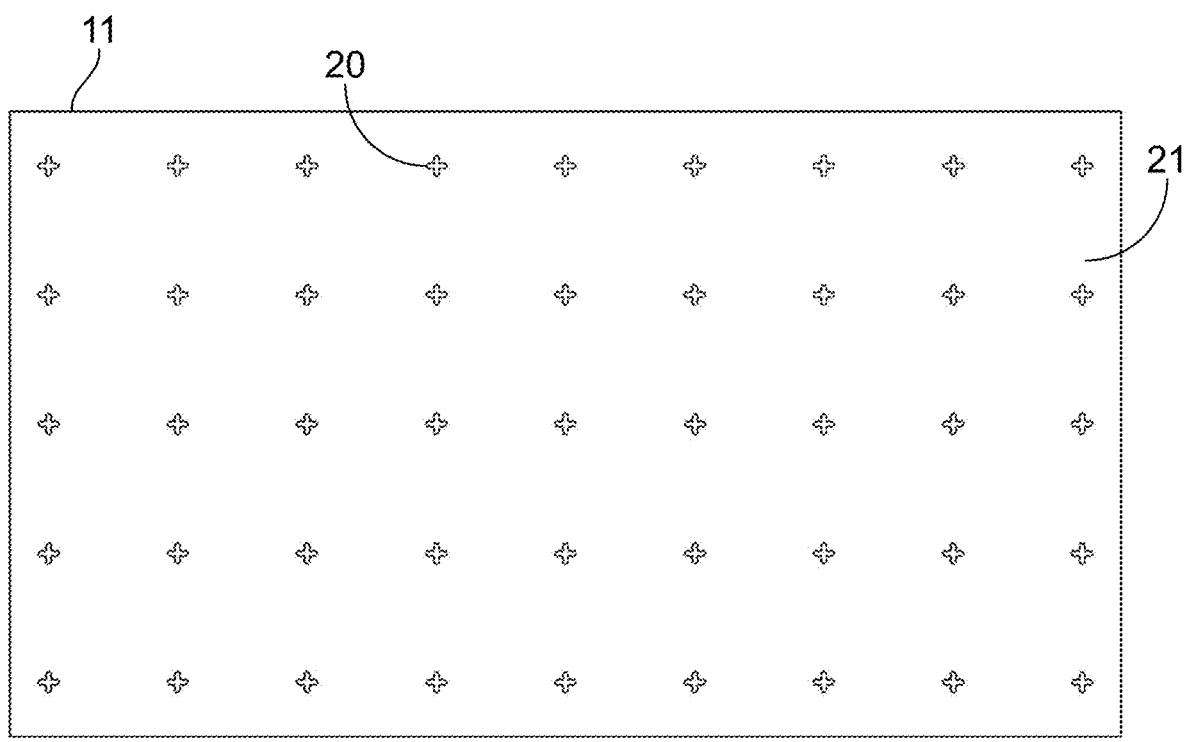
FIG. 2 is a front view of an attachment panel forming part of the simulation system of FIG. 1.

Referring to FIG. 2, the attachment panel 11 according to an embodiment is a planar surface, for example having a rectangular profile as shown. The attachment panel 11 further comprises an arrangement of attachment locations 20 (in the figure, one attachment location 20 is labelled) on a front surface 21 of the attachment panel 11. In the embodiment shown, the attachment locations 20 constitutes recesses into the attachment panel 11. However, it is expected that the attachment locations 20 may constitute projections (at least in part).

In an embodiment, as shown, the arrangement of attachment locations 20 is a regular rectangular array—that is, adjacent attachment locations 20 are equally spaced in a horizontal direction and a vertical direction. However, other arrangements are envisaged, including non-regular and/or non-rectangular arrangements.

The attachment panel 11 can have dimensions suitable for the particular use. In some instances, the sides of the attachment panel 11 may have lengths of less than one metre, for example, when used as a desk- or tabletop teaching aide. In other instances, a side of the attachment panel 11 may have a length of greater than one metre, for example, when used as a front of seminar teaching aide.

Figure 3:
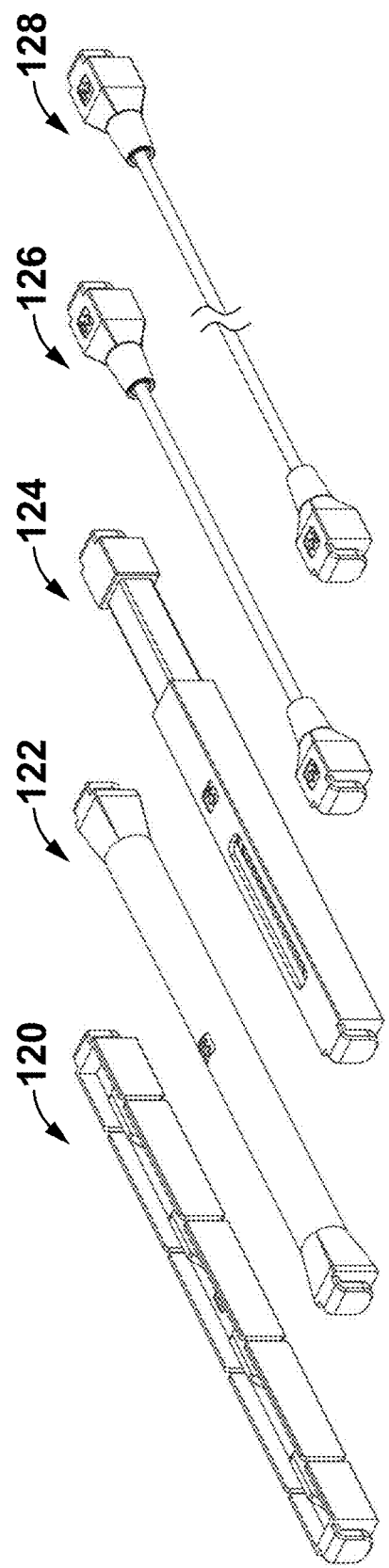
FIG. 3 is an isometric view of typical physical components, in this case linear parts, forming part of the simulation system of FIG. 1.
Figure 4:
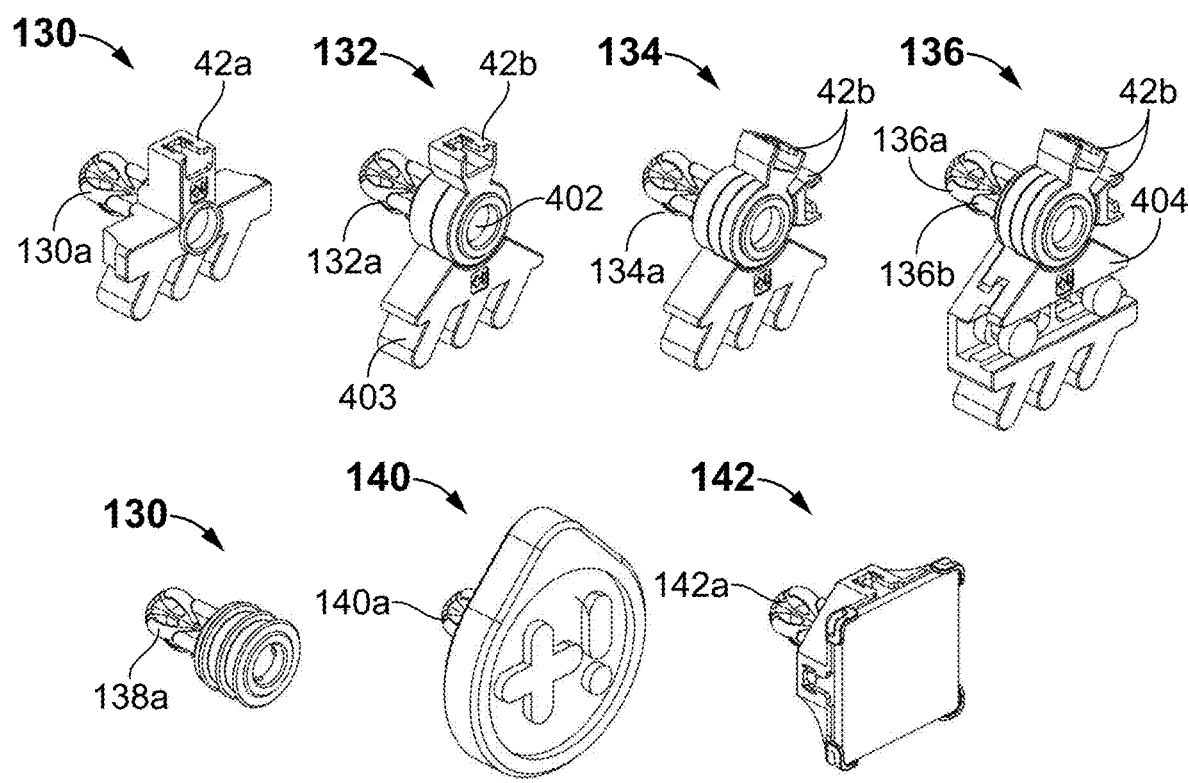
FIG. 4 is an isometric view of typical physical components, in this case anchored parts, forming part of the simulation system of FIG. 1.
Figure 5:
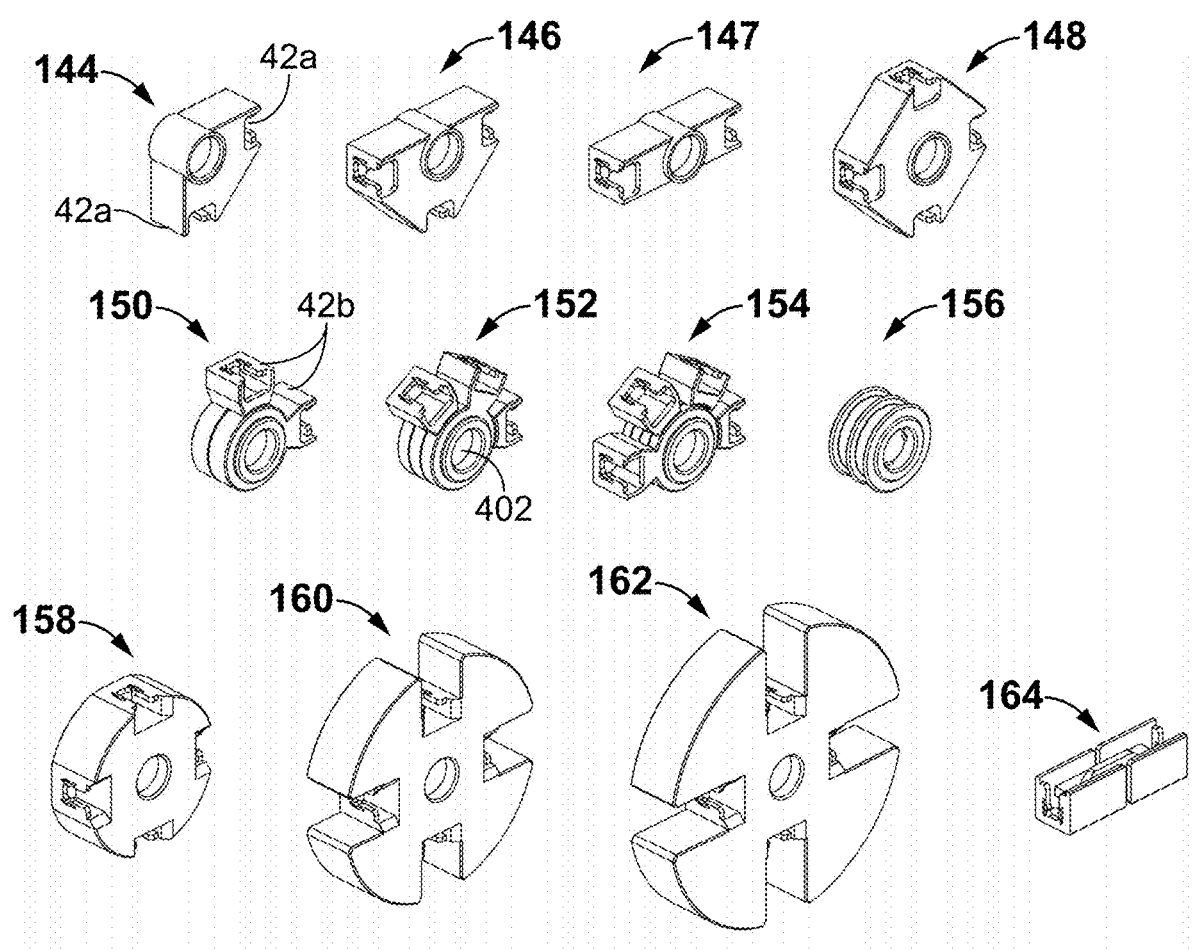
FIG. 5 is an isometric view of typical physical components, in this case joint parts, forming part of the simulation system of FIG. 1.

FIGS. 3 to 5 respectively show examples of examples of physical components for attachment the attachment panel and/or coupling to each other, according to various embodiments.

In this embodiment, the physical components are categorised into linear parts (beam, rod, strut, cable and rope) 120 to 128, anchored parts (rigid anchor, pinned anchors, roller anchor, pulley anchor, dial anchor and tile anchor) 130 to 142 and joint parts (rigid joints, pinned joints, pulley joint, weight joints and extension joints) 144 to 164.

Each physical component is configured to simulate a structural member—for example, a beam, strut, or cable. The physical components are designed to undergo manipulations consistent with the structural component being simulated—for example, bending and axial movements. Some types of physical components are also designed to be removably attachable to other types of physical components. For example, anchor parts and joint parts may be configured to simulate connections between linear parts.

Generally, as the purpose of the physical components in this embodiment is to simulate structural members, a variety (or "toolbox") of different physical components can be provided. Embodiments may be taken to include one or more of the specific examples described but should not be considered limited to such examples.

At least portions of the physical components can be formed using known techniques—for example, injection moulding. It is also envisaged that 3D printing data files could be provided comprising instructions to cause a 3D printer to produce the various physical components described herein.

With respect to FIG. 4, the term "anchored" refers to anchored parts 130 to 142 respectively having anchoring members 130a to 142a configured to enable the anchored parts to be attached to the attachment panel 11. The anchored parts 130 to 142 are shaped to have a complementary profile to attachment locations 20 (e.g., as shown in FIG. 2) such that the anchored parts can be fixed in place through placing (e.g., pushing) the anchoring members 130a to 142a into a complementary attachment location 20. In the examples shown, the anchoring members 130a to 142a comprise a one or more protrusions (such as the protrusion referenced 136b) shaped to fit securely within the recess defined by the attachment locations 20. Relevantly, the shape of the recesses and the anchoring members is such as to restrict (preferably avoid) rotation of the body of the anchored parts 130 to 142. In the example shown, this is achieved with a cross-shaped cross-section.

The attachment locations 20 can each comprise a cross-shaped recess—each attachment location 20 is symmetric with respect to 90-degree rotations. The protrusions are shaped also with a cross-section complementary to the cross-shaped recesses of the attachment locations 20. Therefore, each of the anchored parts 130 to 142 can be attached to the attachment panel 11 in any of four orientations. In other embodiments, different shapes may be utilised. For example, a hexagonally or 6-pointed star shaped recess and projection cross-section arrangement will enable attachment in six orientations. A hexagonal or 8-pointed star will enable eight orientations. Generally, the shape of the recesses and protrusions can be selected as required. It is envisaged that the attachment panel 11 can comprise two or more differently shaped attachment locations 20 with different rotational options.

The anchored parts 130 to 142 can be considered to represent locations at which the structural components being simulated are fixed against certain movements—for example, representing a beam fixed to a ground support.

By way of example, the rigid anchored part 130 comprises one or more fixed direction couplers 42a (one is shown) configured to receive a connection portion of an end of one the linear parts 120 to 128. The fixed direction couplers 42a are fixed with respect to body of the rigid anchored part 130—therefore, the fixed direction couplers 42a do not change orientation when attached to the attachment panel 11.

As another example, the pinned anchored part 132 comprises one or more variable direction couplers 42b configured to receive a connection portion of an end of one the linear parts 120 to 128. In the figure is shown one variable direction coupler 42b. The one or more variable direction couplers 42b are rotatably mounted to body of the pinned anchored part 132, for example, via an axle 402.

The pinned anchored part 132 can comprise a blocking portion 403 (as shown in the figure) to limit the available angles of rotation for the one or more variable direction couplers 42b. In the figure, the blocking portion 403 is formed as a portion of the body of the pinned anchored part 132 and effectively blocks approximately 120 degrees of rotation. Different sized blocking portions 403 can be utilised as required—for example, blocking rotation of greater than 120 degrees or less than 120 degrees. Advantageously, the blocking portion 403 can be shaped to provide a physical representation of the graphical symbols used in the field (e.g. building science/architecture).

The roller anchor 136 is a modification to the pinned anchor 132 and therefore, it includes one or more variable direction couplers (two in the example shown). The roller anchor 136 is configured for restricted movement in relation to the attachment panel 11 in the example shown, the restricted movement constitutes a freedom for a short movement in a single dimension. To enable movement, the roller anchor 136 comprises a mount portion 404 having attached the variable direction couplers 42b slidably mounted to the body 400c, which is itself fixed in movement when inserted onto attachment panel 11.

In contrast to anchored parts 130 to 142, the joint parts 144 to 164 do not include anchoring members and are therefore able to move with respect to the plane of the attachment panel 11. The joint parts 144 to 164 are "floating" and provide for connections between two or more physical components without securing said connections to the attachment panel 11.

By way of example, joint part 152 comprises three variable direction couplers 42b, which are themselves rotationally coupled to one another about axle 402. Optionally, the joint part 152 can comprise a blocking portion (not shown) to limit relative rotation of the variable direction couplers 42b. Therefore, physical components coupled to the joint part 152 are effectively rotatably coupled to one another at the joint part 152.

Another example is joint part 144 which is configured to couple to two or more physical components. In this case, the joint part 144 comprises two fixed direction couplers 42a. The fixed direction couplers 42a are fixedly coupled to one another (and typically will be integrally formed). Therefore, physical components coupled to attachment module 31 *e* are effectively fixedly coupled to one another at a linear or docking part.

Figure 6:
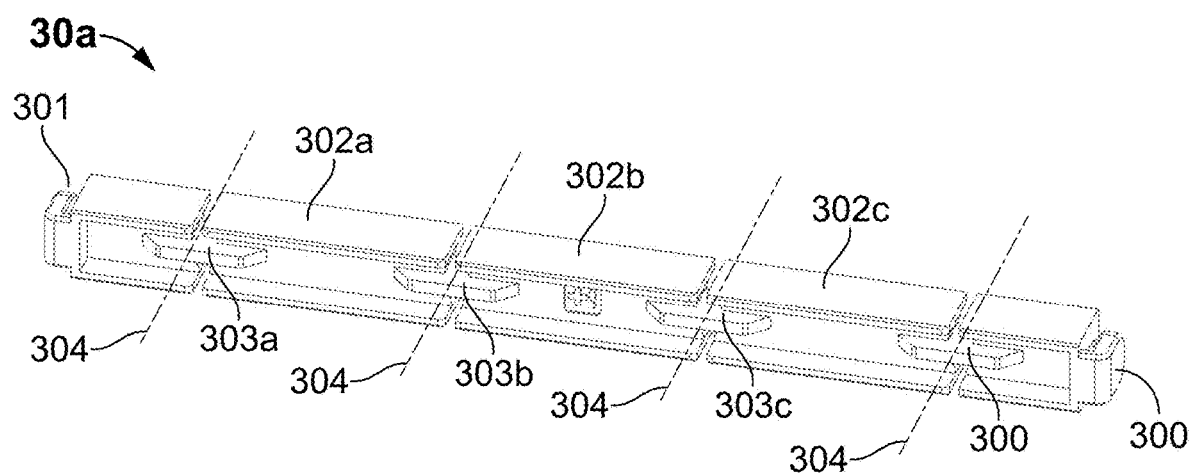
FIG. 6 is an isometric detailed view of a beam linear part as shown in FIG. 3.

FIG. 6 shows an example of the beam linear part 120 in more detail. The beam linear part 120 is configured to simulate a bendable structural component. The term "bendable" is not necessarily intended to refer to a structural component intended to bend by significant amounts—instead, bendable refers to a structural component that may experience bending forces. An example of such a structural component is a beam.

The beam linear part 120 comprises first end piece 300 and second end piece 301. Integrally formed with the end pieces 300, 301 are joints 303a-303d and one or more (in this case, three) structural modules 302a-302c. Joints 303 are configured to enable bending of the beam linear part 120 "in plane" while providing high stiffness with respect to bending "out of plane". In the present embodiment, joints 303 have a planar profile allowing bending in-plane about axis 304. Structural modules 302 are configured to provide stiffness to bending in all directions.

The joints 303 can be designed according to a desired bending property of the beam linear part 120. That is, the thickness and/or length (for example) of the joints 303 can be configured according to a desired bending property. For example, increasing the thickness of the joints 303 can reduce ease of bendability compared to a decrease in thickness. Similarly, a shorter length will typically lead to reduced bendability while a longer length increases bendability. In an embodiment, physical elements 30a are made from materials selected to provide desired bendability.

The configuration of the structural modules 302 may also be selected according to desirable bending properties. For example, considering different bendable physical elements 30a of the same length, the number of structural modules 302 can have an effect on the bending properties—it should be noted that, generally, increasing the number of structural modules 302 reduces the length of the structural modules 302, for the same physical element length.

The beam linear part 120 is configured to have an appearance designed to look like a typical structural I-beam—such an appearance can assist in enhancing the visual perception of the model and the pedagogical value of the element 30a.

Figure 7A:
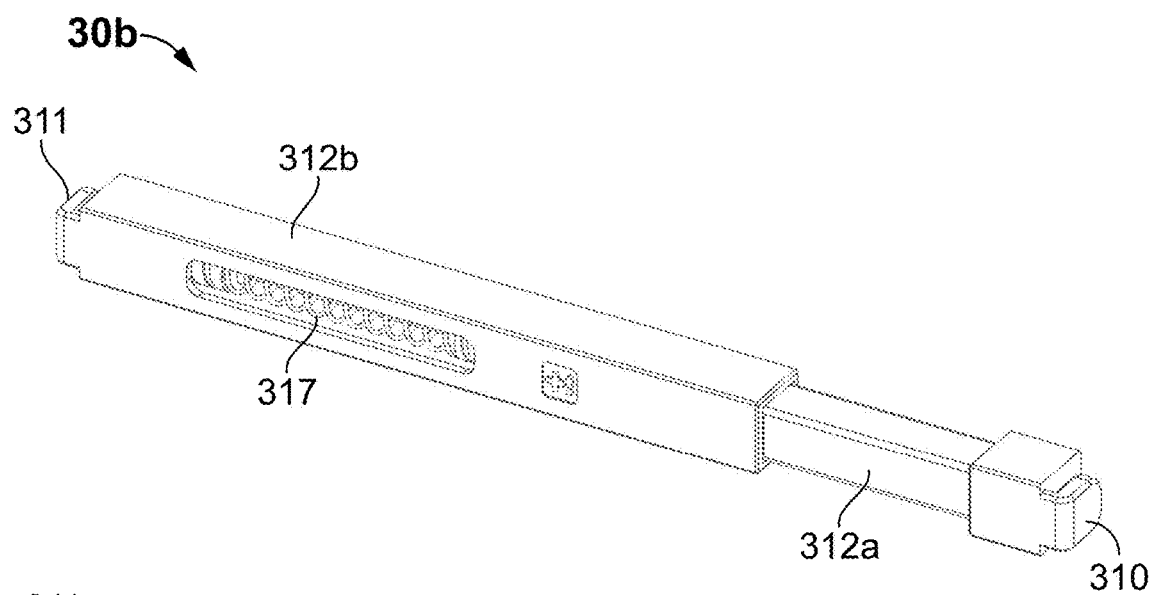
FIGS. 7A and 7B show two isometric detailed views of a strut linear part as shown in FIG. 3.
Figure 7B:
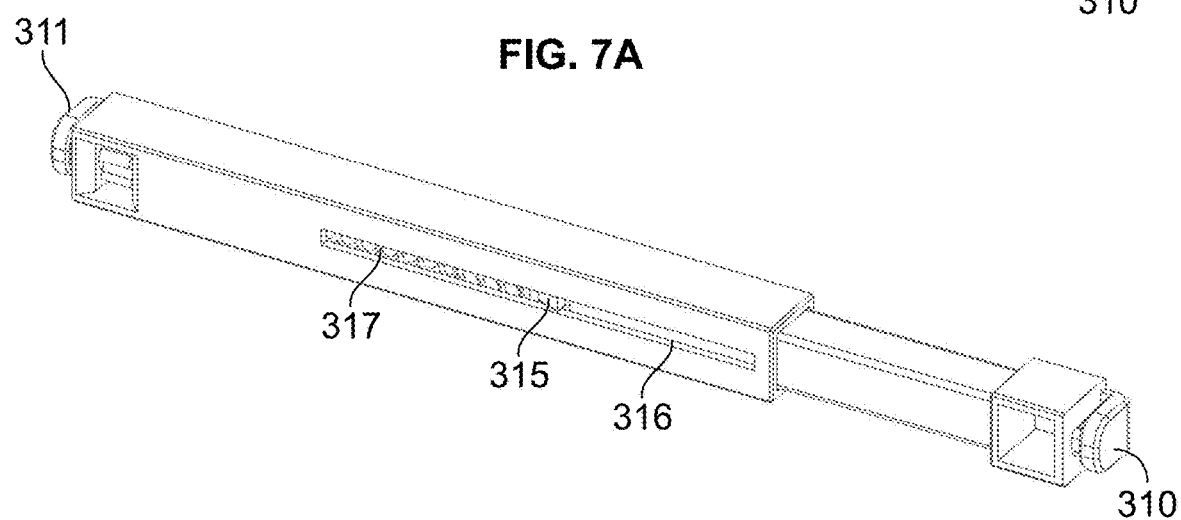

FIG. 7 shows an example of the strut linear part 124 in more detail. The strut linear part 124 is configured to simulate the effect of axial forces which act to compress (and expand) the strut linear part 124 along an axial axis. For example, the strut linear part 124 may simulate a structural component subject to compressive or tensile forces along an axis, such as a strut.

The strut linear part 124 comprises a first end piece 310 and a second end piece 311. The physical element 30b also comprises a first structural module 312a coupled to (optionally integrally formed with) the first end piece 310 and a second structural module 312b coupled (optionally integrally formed with) the second end piece 311. The first structural module 312a is slidably coupled to the second structural module 312b. As shown, the first structural module 312a forms a piston which enters into a cylinder of the second structural module 312b. The first structural module 312a includes a pin 315 extending from its piston portion configured to move within an elongate aperture 316 of the cylinder portion of second structural module 312b such as to limit relative sliding movement of the first structural module 312a and second structural module 312b. Also shown in FIG. 3B, spring 317 is provided coupled to both the first end piece 310 and the second end piece 311, configured to provide both tension and compression between the end pieces 310, 311.

The strut linear part 124 can be designed to simulate different structural components through variations in configuration and design. For example, different strength springs 316 can be utilised to simulate different responses to axial forces (e.g. different stiffness). Additionally, a length of aperture 315 can be selected to set a maximum extent of relative movement between the first structural module 312a and the second structural module 312b. In an embodiment, the springs 316 is interchangeable with springs 316 having different spring constants.

Figure 8:
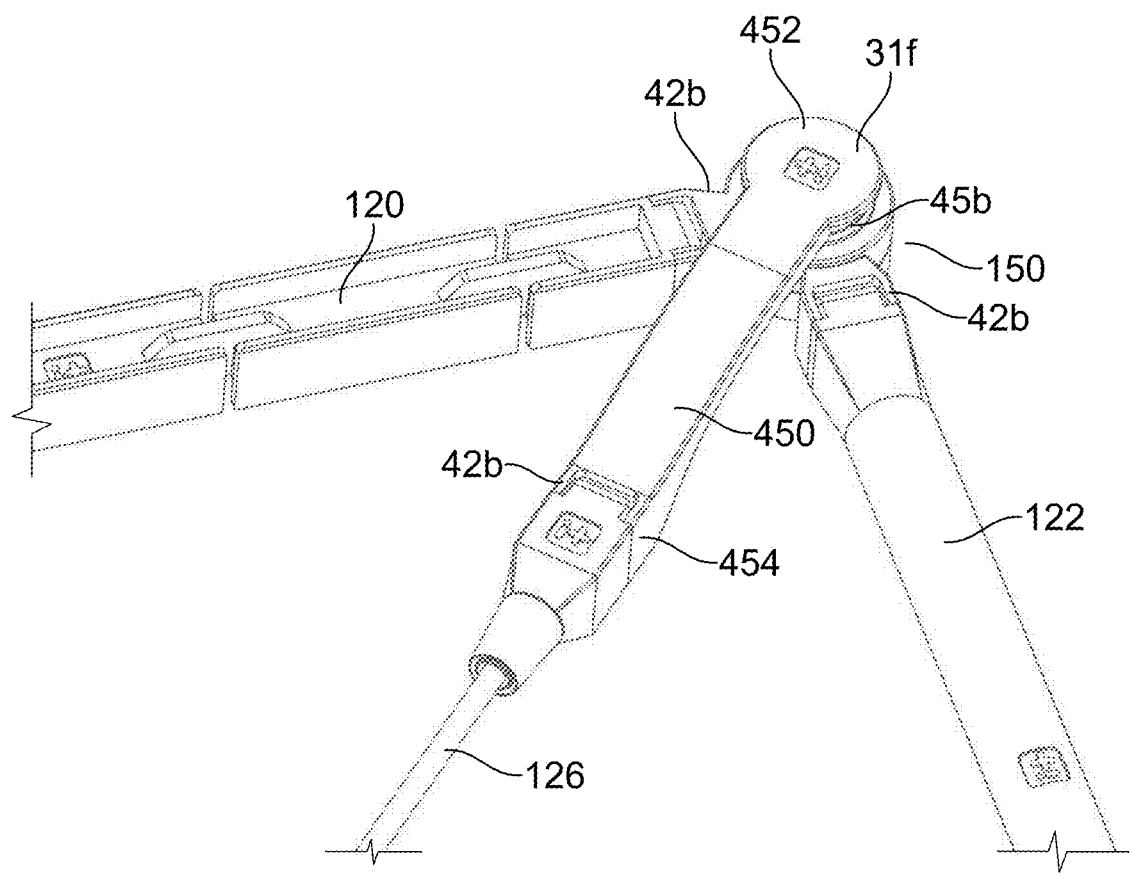
FIG. 8 is an isometric view of a further physical component, in this case a docking part, showing its docking to beam, rod and cable linear parts.

FIG. 8 shows an example of a cable linear part 31f. Cable linear part 31f comprises one or more cable couplers 42c (one is shown). Each cable coupler 42c is couplable to a cable physical element 30c. The cable linear part 31f may be floating (as shown) or anchored (not shown). The coupling feature can be flexible, inflexible, etc.

Cable linear parts are configured to simulate a structural member which communicates forces via a tension. Generally, a force is only transmitted when the cable linear part 30c is taut. The cable linear part 30c comprises a first end 320 and a second end (not shown) and define a cord, rope, or other cable-like object 322. A semi-inflexible the cable linear part 30c may be utilised, configured to allow a transfer of force in a different direction to a tension force. In the embodiment shown, the first end 320 is attached to a cable coupler 42c of a cable linear part 31f.

FIG. 8 illustrates a docking part 31f which facilitates diagonal connections using standard length 'linear parts' of the sort referenced 120 to 128 in FIG. 3. In this exemplary case, the beam linear part 120 is connected to the rod linear part 122 by the pinned joint 150. The pinned joint 150 include an aperture which, in use, extends perpendicularly from the plane of the assembly panel 1.

The docking part 31f includes a central elongate body 450, a docking head 452 and a coupling tail 454. The docking head 452 includes a male docking member 456 adapted for insertion into the aperture extending through the pinned joint 150. The coupling tail 454 includes a direct coupler 42b for engagement with another linear part, in this case the cable linear part 126, extending diagonally across the configuration of physical components mounted to the attachment panel. The male docking member is preferably rotatably within the aperture so that the angle at which the cable linear part 126 or like linear part extends cross the configuration of physical components mounted to the attachment panel can be varied as desired.

Figure 9:
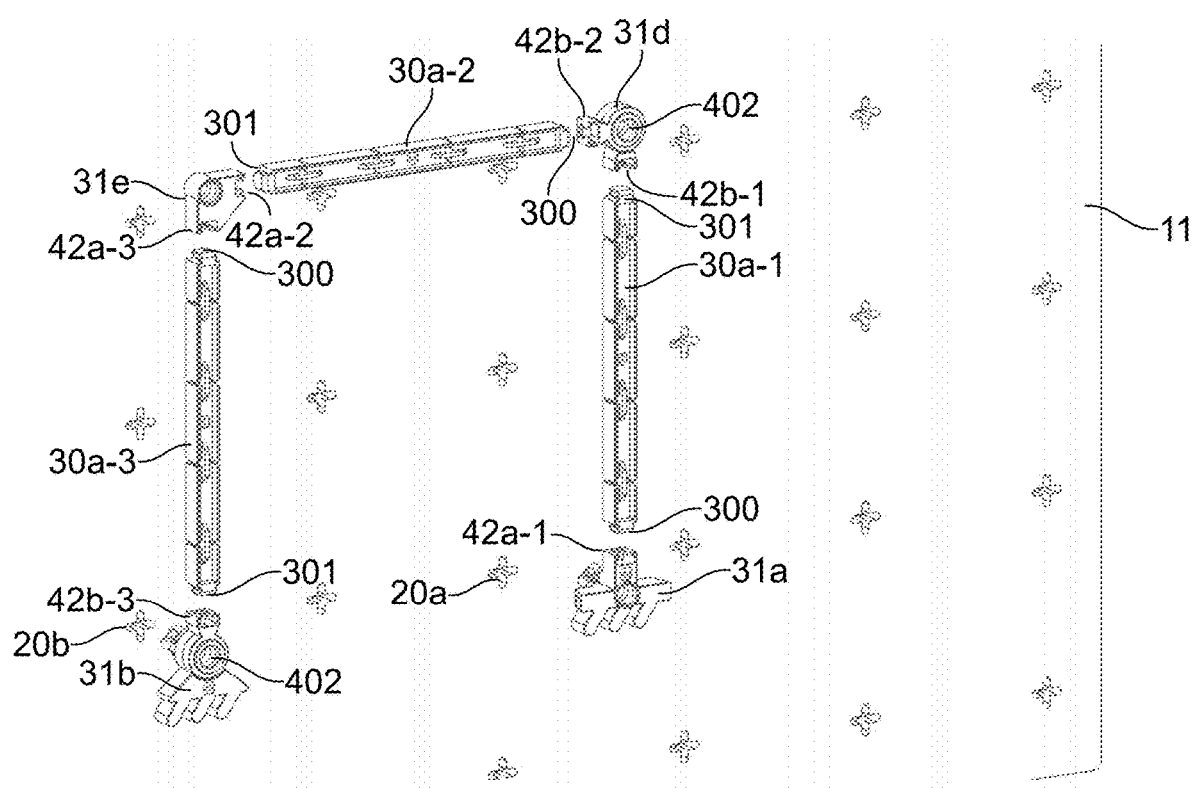
FIG. 9 is an isometric view of a configuration of physical components and showing their attachment of an attachment panel forming part of the simulation system shown in FIG. 1.

FIG. 9 shows an example of a collection of physical components and the attachment panel 11 with attachment locations 20—in combination, these are referred to as a "configuration". In particular, the figure shows how the physical components are attached to one another and notably how the anchored parts attach to the attachment panel 11. As shown, there are three bendable physical components 30a-1, 30a-2, 30a-3. There are also anchored parts 31a and 31 b. There is also floating joint part 31 d (allowing rotational movement) and floating joint part 31 e (not allowing rotational movement).

Anchored part 31a is located with a fixed direction coupler 42a-1 facing upwards. It receives the first end piece 300 of physical component 30a-1. Anchored 31 a is to be received by the attachment panel 11 at attachment location 20a. The second end piece 301 of physical component 30a-1 is configured to be received by variable direction coupler 42b-1 of floating joint part 31 d. Note that floating joint part 31 d is not attached to the attachment panel 11. Variable direction coupler 42b-2 of attachment module 31d receives the first end 300 of physical component 30a-2. The second end 301 of physical component 30a-2 is received by fixed direction coupler 42a-2 of floating joint part 31 e. Fixed direction coupler 42a-3 of floating joint part 31 e receives the first end 300 of physical element 30a-3. The second end 301 of physical element 30a-3 is received by variable direction coupler 42b-3 of anchored part 31 b. Note that anchored part 31 b allows movement of its variable direction coupler 42b-3 around axle 402. Anchored part 31a is to be received by the attachment panel 11 at attachment location 20b. The configuration can be deformed by application of a force at one or more points on the components 30, 31. The deformation is constrained by a variety of factors, in this example including the positions of the attachment locations 20a, 20b, the rotatability (or not) the parts 31, and the bending properties of the physical components 30.

Referring to back to FIG. 1, the display system 12, according to an embodiment, comprises a projector 50. The projector 50 is configured to project an image onto the attachment panel 11—in the example shown, the projector 50 projects onto the front surface 21 of the attachment panel 11. However, it is envisaged that in another embodiment, the projector 50 projectors onto a rear surface of the attachment panel 11 in this case, the attachment panel 11 should be sufficiently translucent to enable a user to view the projected image on the front surface 21. The display system 12 can take other forms, depending on the embodiment. For example, an LCD or OLED screen may be formed as a feature of the attachment panel 11.

According to an embodiment, the display system 12 is controlled by a controller 14. Therefore, the display system 12 is in data communication with the controller 14, whereby the controller 14 is enabled to communicate display data to the display system 12 providing an image for display. The data communication can be of a known type, for example using a digital standard such as HDMI, DVI, DisplayPort, or USB, or an analogue standard.

The display system 12 is configured to present the image visualisation (it should be understood that "visualisation" includes a rear visualisation) the attachment panel 11. The visualisation takes into account any physical components 30, 31 presently coupled (e.g. attached) to the attachment panel 11, thereby providing an integrated experience of visualisation image with components 30, 31.

Still referring to FIG. 1, a capture device 13 is interfaced with the controller 14—in the example shown, the capture device 13 comprises an infrared camera or an RGB camera or a monochrome camera or depth field camera. The capture device 13 is configured to capture image data and depth representing a current state of the attachment panel 11. The capture device 13 communicates the image data to the controller 14. The controller 14 is typically configured to receive a user input and to present a display to a user (e.g. via human interface devices (HID)).

Referring to FIGS. 10 to 13, an interaction device 51 (herein, also referred to as "wand 51") is optionally provided. The wand 51 has a defined visual property (or properties) which is known to controller 14—typically, information enabling the controller to visually identify the position and typically orientation of the wand 51 is stored in a memory of the controller 14.

It will be appreciated that in other embodiments, a user may interact with the physical components manually, for example, by using their hand.

Figure 10A:
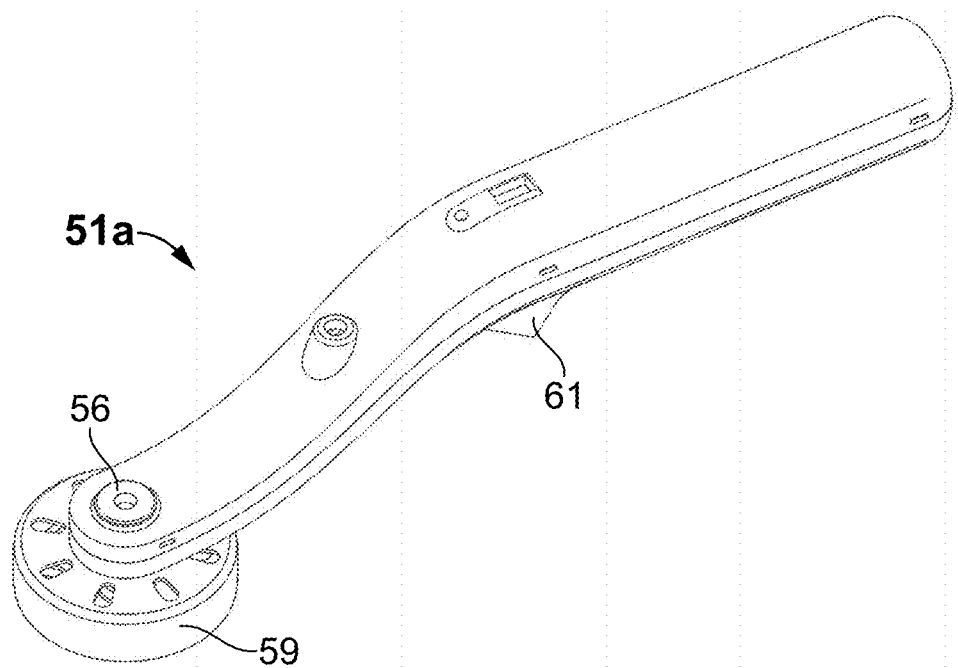
FIGS. 10A and 10B show two isometric views of a user interaction device ("wand") forming part of the simulation system shown in FIG. 1.
Figure 10B:
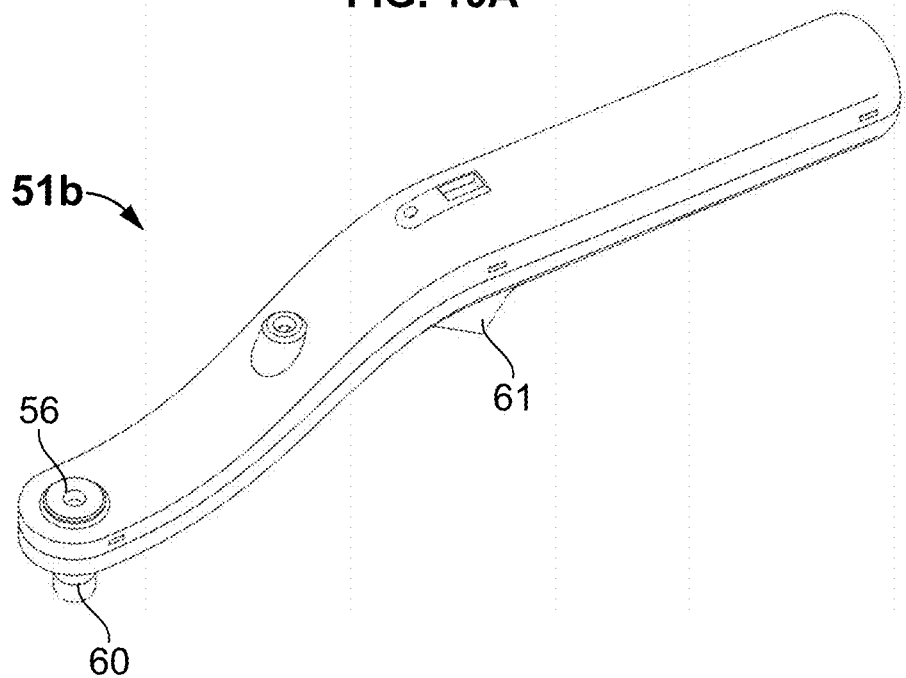
Figure 15:
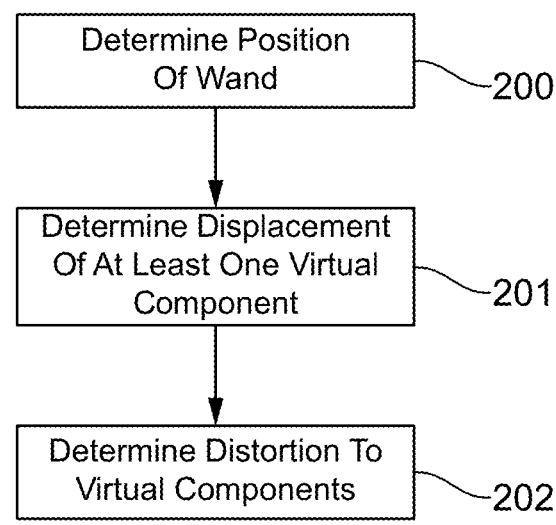

Referring to FIG. 10 in particular, the wand 51 of the present embodiment comprises one or more electromagnetic sources 56—in the example shown, the wand 51 comprises one infrared LED. The electromagnetic source(s) 56 generally should be visible to the capture device 13—in the present embodiment, the capture device 13 is an infrared camera. Two modes are shown in FIG. 15—"beam push" mode where the wand 51*a* is configured to push into components 30, 31 (in particular, a bendable physical component). In this mode, the wand 51 *a* comprises a wheel 59 configured to roll and thereby minimise friction between the wand 51 and the physical component. The other mode is "node pull" mode where the wand 51 *b* is configured to pull a physical component (again, for example, a bendable physical component) via hooking member 60. One (or more) electromagnetic source 56 may further be configured to communicate information to the controller 14, for example, through pulsed operation. The information may be in response to a user input, for example, via trigger 61. For example, a pulse may indicate "selection" of a displayed option by a user, where the particular displayed option is selected by placing the wand at a location corresponding to the selection and the user activating the trigger.

Alternatively (or in addition), the wand 51 may include, for example, features easily visible under infrared light when the capture device 13 comprises an infrared camera. In an example, the wand 51 has a defined shape in two- or three-dimensions and the controller 14 is configured to identify said shape from the image data. The defined shape may, for example, enable the controller 14 to determine an orientation of the wand 51.

Figure 14:
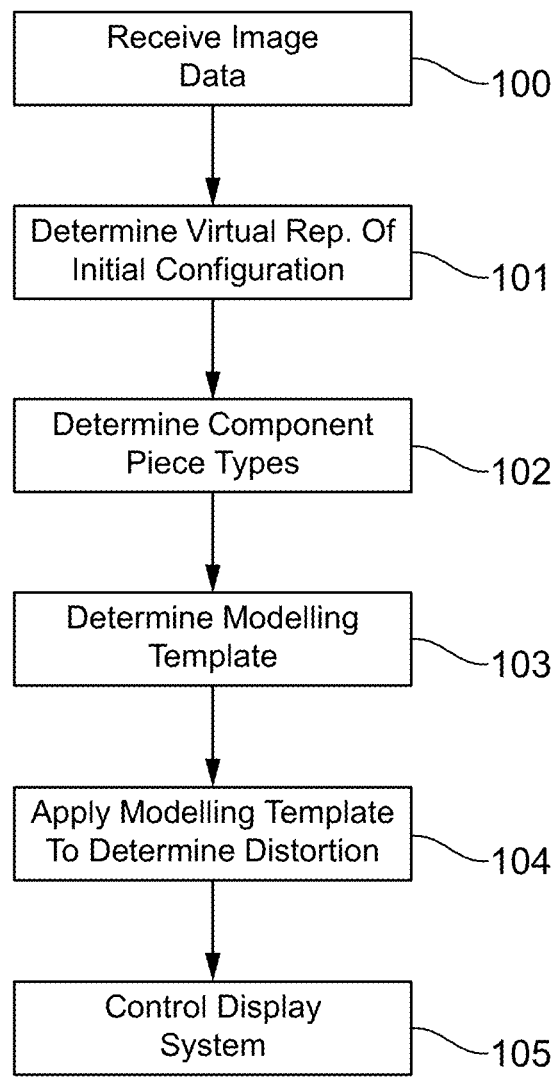
FIGS. 14 and 15 are flowcharts showing steps performed by a controller forming part of the simulation system shown in FIG. 1.

According to an embodiment, as shown in FIG. 14, the controller 14 is configured to receive image data from the capture device, at step 100, in response to determining the presence of an initial configuration of components 30, 31 attached to the attachment panel 11. The determination can be, for example, in response to a user input indicating that the initial configuration is present.

The controller 14 is further configured to determine a virtual representation of the initial configuration, at step 101. The virtual representation assigns a virtual component to each physical component 30, 31—thus, there can be (for example), a virtual beam and a virtual strut. Generally, the controller 14 is configured to simulate distortions to the virtual components in a manner consistent with distortions applied to the components 30, 31 (explained below).

Figure 17:
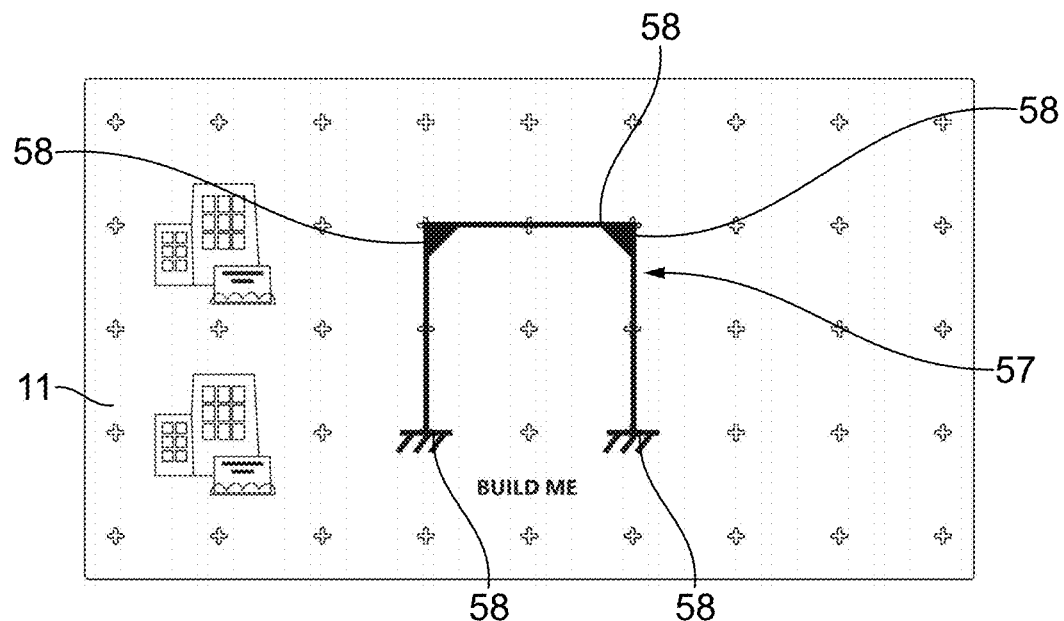
FIGS. 17 and 18 depict the display by a display system forming part of the simulation system shown in FIG. 1 of a template on the attachment panel shown in FIG. 2.
Figure 18:
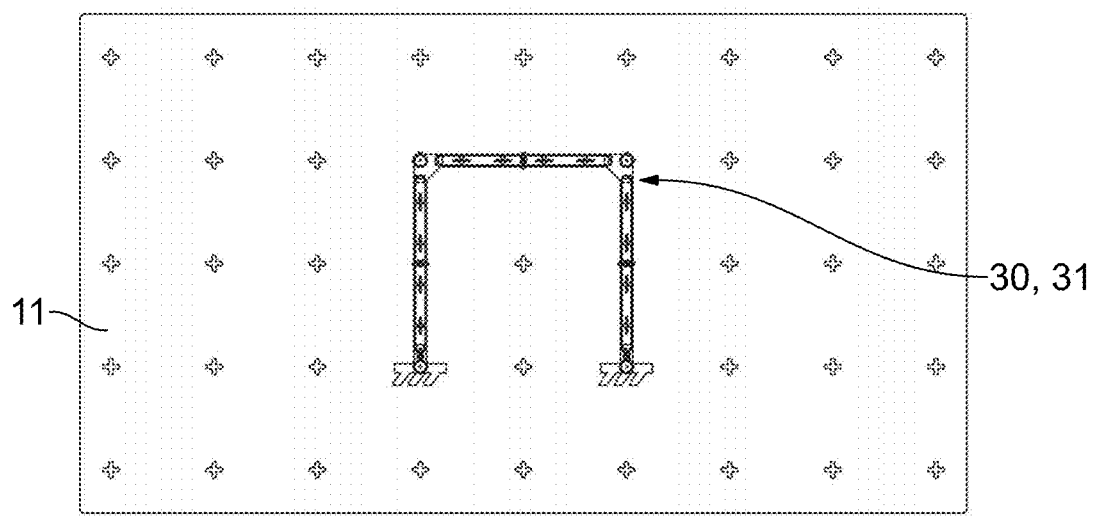

In an embodiment, with reference to FIGS. 17 and 18, the controller 14 is configured to cause the display system 12 to display a template 57 of a particular configuration of physical components 30, 31 on the attachment panel 11. The display template 57 provides an indication of which physical components 30, 31 should be attached to the attachment panel 11, where the physical components 30, 31 should be attached, and how the various physical components 30, 31 should be attached to one another. In the implementation shown, the template 57 comprises component symbols 58 for each physical component 30, 31, where each component symbol 58 is selected to have an appearance similar to that of the physical components 30, 31 (for example, a similar profile or 2-dimensional representation). A user can then attach the corresponding physical components 30, 31 according to the template 57. As the template 57 is displayed on the attachment panel 11, it is relatively easy for the user to set up the correct configuration of physical components 30, 31—the user simply attaches the relevant physical components 30, 31 in the correct positions.

In an embodiment, the user is enabled to provide input to the controller 14 specifying which virtual components to use and the relationship between the virtual components—thus, the user is responsible for configuring the arrangement of virtual components such that the arrangement is consistent with the arrangement of components 30, 31 on the attachment panel 11.

In another embodiment, the image data is processed by the controller 14 in order to identify one or more virtual components corresponding to components 30, 31 presently coupled to the attachment surface 11. Generally, the processing can utilise known imaging processing algorithms and techniques. The process of identifying one or more individual physical components 30, 31 also comprises determining a current shape and position of the physical components 30, 31—this is stored in a data variable. Generally, the current shape and position can be represented by different methods, as desired. For example, using a bitmap approach or vector approach.

According to an embodiment, the configuration of the virtual components is recorded in reference to the attachment surface 11—that is, the attachment surface 11 is considered to define a reference plane, and the current virtual configuration is recorded with respect to its location on the attachment surface 11

For each identified physical component 30, 31, the type of the component 30, 31 is determined, at step 102. Identification (for each component) includes determining whether the component 30, 31 is a physical element 30 or an attachment module 31. The controller 14 also determines the type of physical element 30 or attachment module 31 (as applicable). This information is stored in a data memory in association with the current shape and position. In a relevant embodiment, the identification of components 30, 31 and type is provided by the selected template 57.

As a result of steps 101 and 102, the controller has, in memory, information indicating a current set of one or more virtual components corresponding to the physical components 30, 31 present on an attachment surface 11, the virtual components associated with information indicating the type of each physical component 30, 31 and its original shape and position on the attachment panel 11. The controller 14 can be configured to identify component parts using imaging analysis techniques. Also, or in the alternative, the controller 14 may be provided with depth information as part of the image data—this may be obtained, for example, using a time-of-f light sensor (e.g. an infrared time-of-flight sensor)—and based on this depth information, the controller 14 can be configured to identify individual component parts. Such image and/or depth analysis may also be used to identify particular types of component part, for example, based on templates pre-provided to the controller 14 (e.g. stored in a memory of the controller 14). Other methods may also be incorporated in relation to steps 101 and 102—for example, each type of component part may be coloured uniquely such that the type of component part can be determined, at least in part, based on its colouring. Image processing using an algorithm determined using machine learning may be implemented, where the machine learning is taught to identify the various physical components 30, 31.

The controller 14 then determines, at step 103, a selected modelling template. The current modelling template may be user selected from a set of one or more modelling templates. Each modelling template defines a physical model to apply to the current arrangement of components 30, 31 such as to determine display data to communicate to the display system 12. For example, a modelling template comprises information indicating how the virtual components should deform in response to a deformation applied to the corresponding configuration of physical components 30, 31. The modelling template may also comprise information enabling a determination of simulated physical characteristics associated with the physical components 30, 31—for example, indicating stresses and/or forces being simulated by the physical components 30, 31.

The controller 14 is then configured to determine a distortion to the virtual components corresponding to a distortion made to the configuration of components 30, 31, at step 104. The distortion results from one or more forces being applied to the physical components 30, 31, thereby causing the shape defined by the arrangement of physical components 30, 31 to change. The distortion is constrained by the actual physical components 30, 31 used and their locations—for example, anchored attachment modules 31a, 31 b, 31 c cannot move with respect to their location on the attachment panel 11. Bendable physical components 30a may bend but not compress or expand, whereas compressible physical components 30b cannot bend. Floating physical components 31 d, 31 e can move with respect to the attachment panel 11, and therefore, ends 300, 301, 310, 311 of the physical components 30 coupled to floating physical components 31 d, 31 e can move with respect to the attachment panel 11. As a corollary, ends 300, 301, 310, 311 coupled to anchored physical components 31 a, 31 b, 31c cannot move with respect to the attachment panel 11. Physical components 31 with variable direction couplers 42b do, however, enable rotational movement of coupled ends 300, 301, 310, 311.

Referring to FIG. 15, in an embodiment, the controller 14 is configured to determine the distortion to the virtual components based on a current position and, in an implementation, orientation of the wand 51. The controller 14 is configured to determine a current position (and optionally orientation) of the wand 51, at step 200. The controller 14 is then configured to determine a corresponding displacement of at least one virtual component by assuming that the wand 51 has obtained its current position by contacting the one or more physical components 30, 31 and forcing them to distort to enable the wand 51 to reach its current position, at step 201. The controller 14 may employ a collision model in order to determine when the wand 51 is interacting with a component 30, 31— the controller 14 does so by determining that the wand location has resulted in a collision with a virtual component.

The controller 14 is also configured to determine, through application of the modelling template, a distortion for each virtual component based on the properties of each virtual component (e.g. fixed in place, bendable, etc.), at step 202. Thus, the controller 14 is configured to calculate a current shape defined by the distorted virtual components. Steps 201 and 202 may occur simultaneously—in that, the distortion caused by the wand 51 can affect the entire shape of the virtual components.

In another embodiment, the controller 14 is configured to continuously receive image data showing a current shape of the physical components 30, 31. From this data, the controller 14 is configured to determine the corresponding shapes of the virtual components.

Referring back to FIG. 14, the controller 14 then applies the selected modelling template to the current arrangement of virtual components (corresponding to the current arrangement of physical components 30, 31) at step 104 to generate display data to the display system 12, at step 105.

In response to step 105, the display system 12 displays the display data as an image visualisation to the attachment panel 11, as previously described. For example, the modelling template interprets the current arrangement of physical components 30, 31 as a model of a physical system. For example, an arrangement of struts (i.e. physical elements 30) with particular types of connections (i.e. attachment modules 31). The selected modelling template also defines a visual response to the arrangement of physical components 30, 31—for example, a visual display indicating particular forces and/or stresses according to the physical system currently being modelled.

Figure 11:
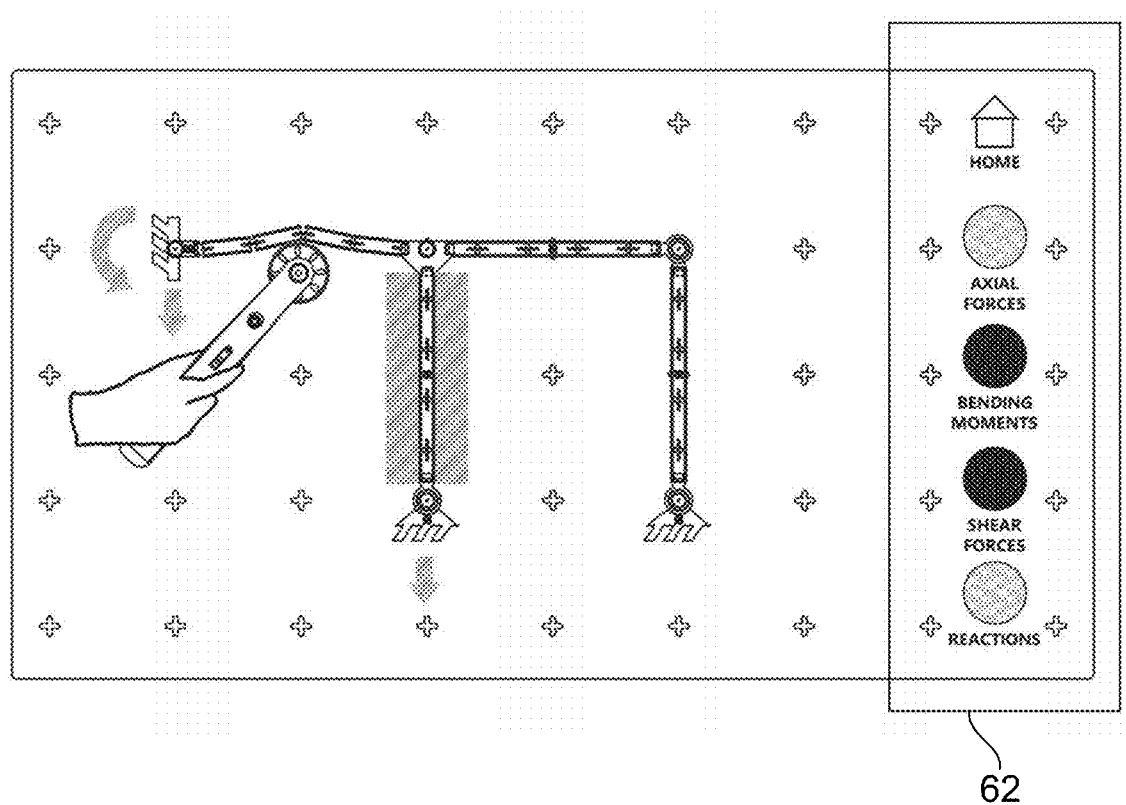
FIGS. 11 to 13 are representations of use of the user interaction device shown in FIG. 10 with a configuration of physical components and attached to an attachment panel forming part of the simulation system shown in FIG. 1.
Figure 12:
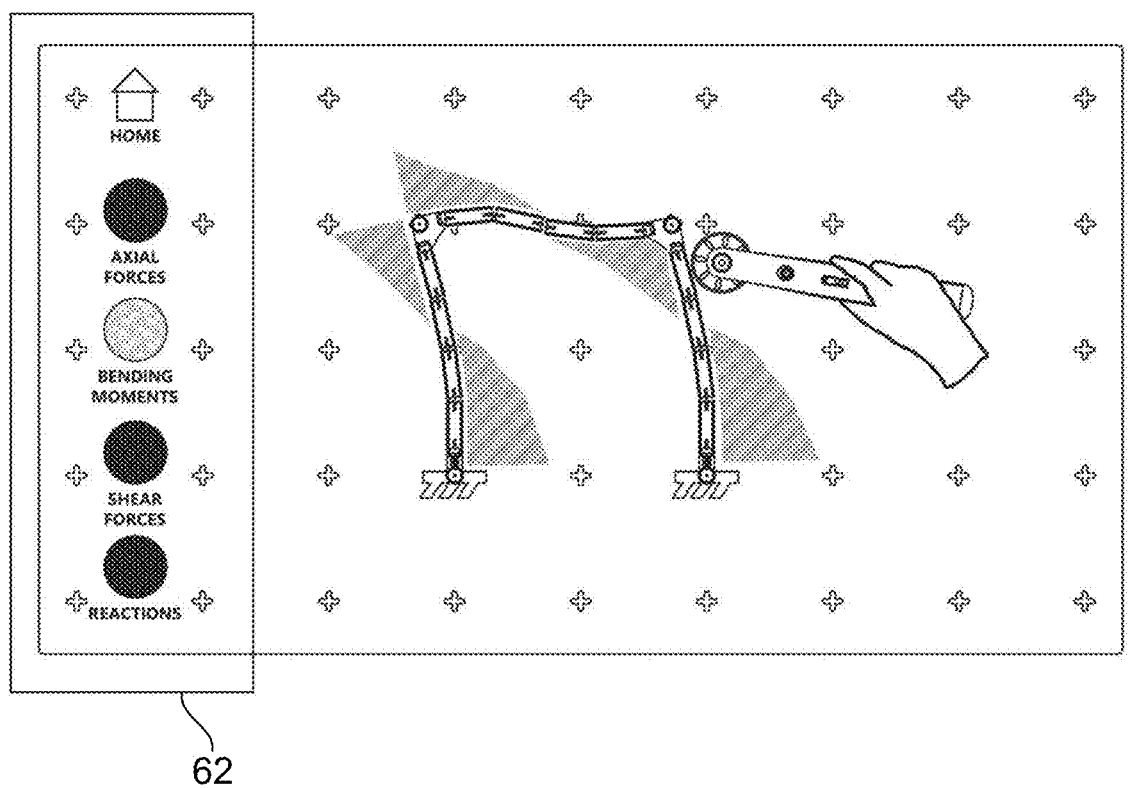
Figure 13:
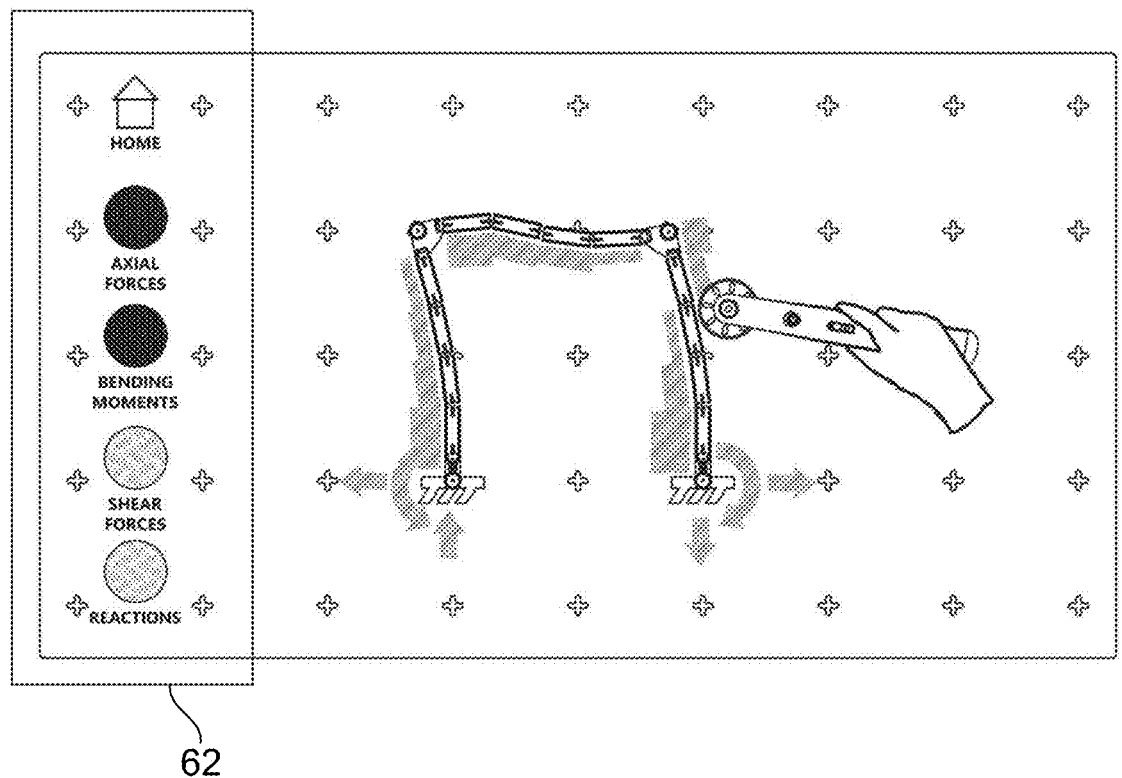
Figure 19:
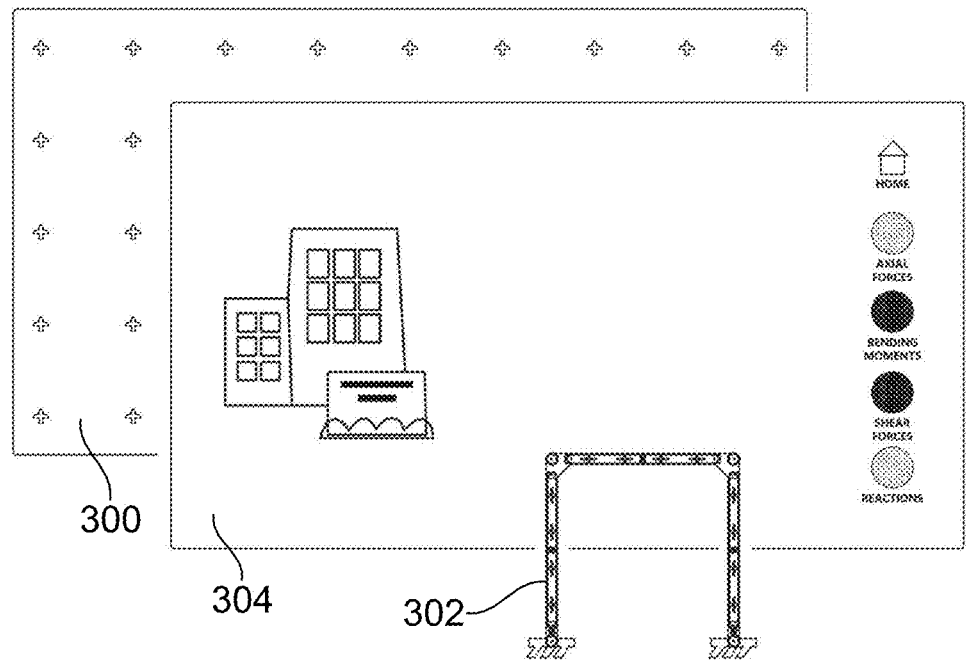
FIGS. 19 and 20 are respectively isometric views of embodiments of the simulation system using 2-dimensional and 3-dimensional display systems.
Figure 20:
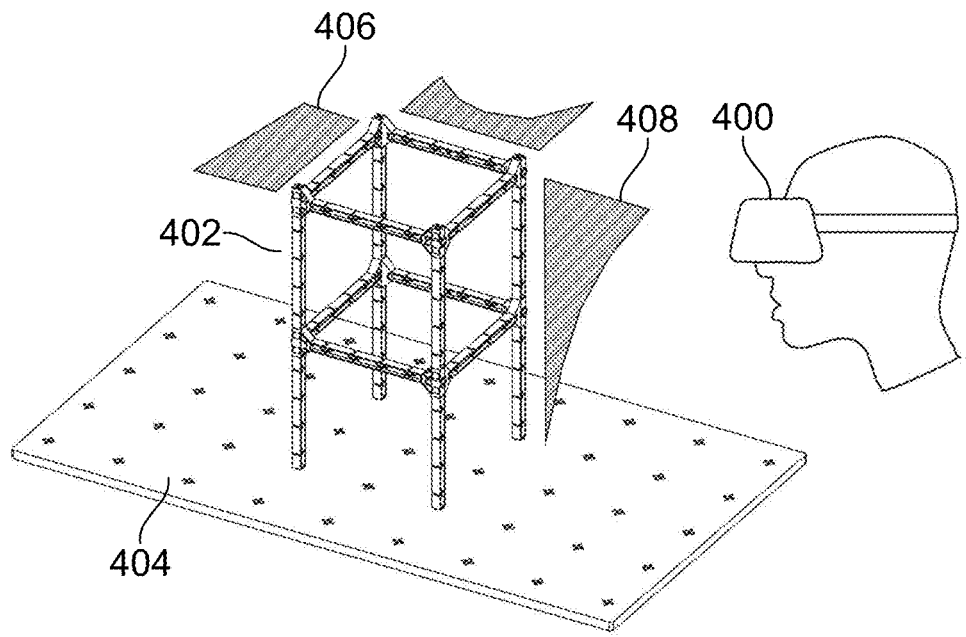

FIGS. 11 to 13 illustrate several features. For example, in each figure is shown a selection interface 62 to select one or more modelling templates. In FIG. 11, modelling templates "axial forces" and "reactions" are selected. In FIG. 19, modelling template "bending moments" is selected. In FIG. 20, modelling templates "shear forces" and "reactions" are selected. The figures also illustrate different visualisations showing the modelled physical properties (e.g. axial force, reaction, bending moment, shear force)—these are illustrated in different ways. Relevantly, the visualisations are dynamic and change with response to wand position—which in turn is related to distortion of the configuration of components 30, 31.

For reference, modelling of physical systems is described in the following publications by the present inventor:
QUINN, G: "Augmented and Virtual Reality Structures", Proceedings of the IASS Annual Symposium 2004, September 25-28th, 2017, Hamburg, Germany.
QUINN, G: "StructVR Virtual Reality Structures", Proceedings of the IASS Symposium 2018, Jul. 16-20, 2018, MIT, Boston, USA.

The present disclosure includes a number of features not defined in these publications—for example, the controller 14 may be configured to identify types of physical elements 30 and attachment modules 31 that are present, and to include this information when applying the model. The techniques disclosed in the prior art require the information on which physical elements 30 and attachment modules 31 to be pre known by the controller 14—for example, through predefinition in programming.

Therefore, the embodiments described herein offer greater flexibility of simulation and easier configuration—the user is, in effect, enabled to configure the modelling template by coupling various physical components 30 and physical components 31 to the attachment panel 11. For example, the physical components 30a is discretised by structural modules 302 to advantageously represent the finite element discretisation of the simulation defined by the modelling template—this may advantageously mean that the plotting of forces is matched to the actual distortion of the physical components 30a.

Figure 16:
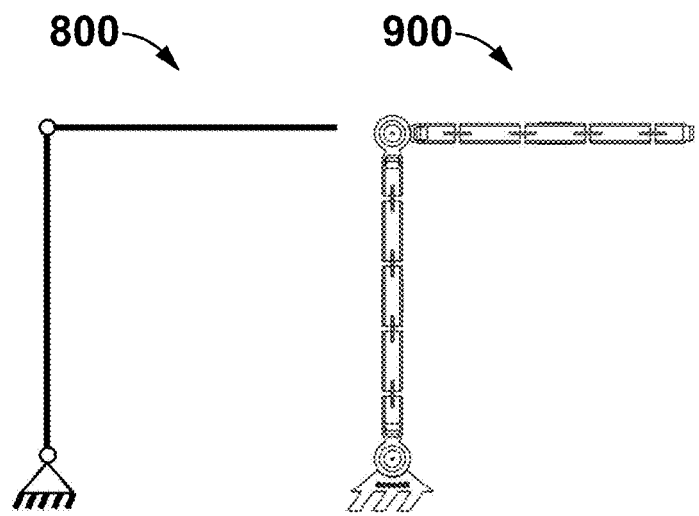
FIG. 16 shows how physical components forming part of the simulation system shown in FIG. 1 can be shaped to resemble common symbols for corresponding features.
Figure 16:
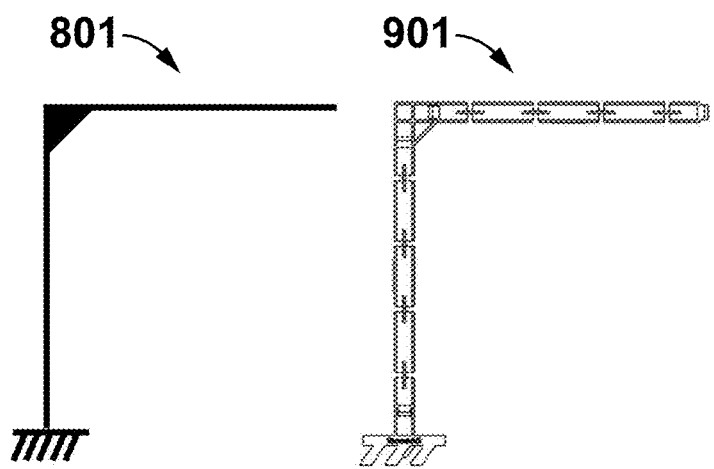

In an advantageous implementation, with reference to FIG. 9, the physical components 30, 31 are shaped such as to resemble common symbols for the corresponding features. For example, schematic symbols 800 see in FIG. 16 includes features visually identifiable on the components of configuration 900, and schematic symbols 801 includes features visually identifiable on the components of configuration 901. In an embodiment, these standardised symbols are projected as part of the visualisation by the display system 12.

Further modifications can be made without departing from the spirit and scope of the specification. As can be seen in FIG. 19, embodiments described hereabove include an attachment panel 300 and an assembly of physical components 302 one or more of which are attached to the attachment panel 300. In the above described examples, a visualisation 304 comprising an indication of a physical effect associated with a change to behavioural properties of the configuration of virtual components created by a controller forming part of the system is provided on the attachment panel 304 by the projector 50.

However, as seen in FIG. 20, in other embodiments of the invention the display system may comprise an augmented reality headset 400 operably connected to the controller 14 in the same manner as the projector 50. Such an arrangement is particularly suited to embodiments of the invention in which the assembly 400 of physical components attach to the attachment panel 402 is a 3-dimensional structure (as opposed to the 2-dimensional structure shown in FIG. 26). In this case, the augmented reality headset 400 (displaced) provides a visualisation 406 and 408 on approximate one or both of the attachment panel 404 and the assembly 402 of physical components.

It will be appreciated that the foregoing embodiments are examples of a simulation system which can be more broadly characterised as comprising a plurality of physical components, each corresponding to one of a plurality of component types, an attachment panel comprising an arrangement of attachment locations, such that one or more of the physical components are attachable to the attachment panel; a display system configured to provide a visualisation on or proximate one or both of the attachment panel and the plurality of physical components; a capture device configured to capture image data of a current status of the attachment panel and the plurality of physical components; and a controller configured, when at least one component is coupled to the attachment panel, to: a) determine a configuration of physical components one or more of which are coupled to the attachment panel; b) create a configuration of virtual components by assigning a virtual component for each physical component of the configuration of components; c) identify a user's physical interaction with the configuration of physical components and determine a corresponding change to behavioural properties of the configuration of virtual components; d) apply a selected modelling template to the current arrangement of virtual components to generate a visualisation comprising an indication of a physical effect associated with the change to the behavioural properties; and e) cause the display system to display the visualisation.

Although described with respect to components 30, 31 corresponding to physical structures, simulation system can be adapted to represent other physical systems, for example, chemical, electrical, quantum systems. These representations may include additional layers of abstraction, while relying on specific physical elements 30 and attachment modules 31 representing specific aspects of the system. Also, the controller 14 is configured in these adaptations to identify the aspect of the system currently being represented by identifying the particular type of physical element 30 or attachment module 31.

Figure 21:
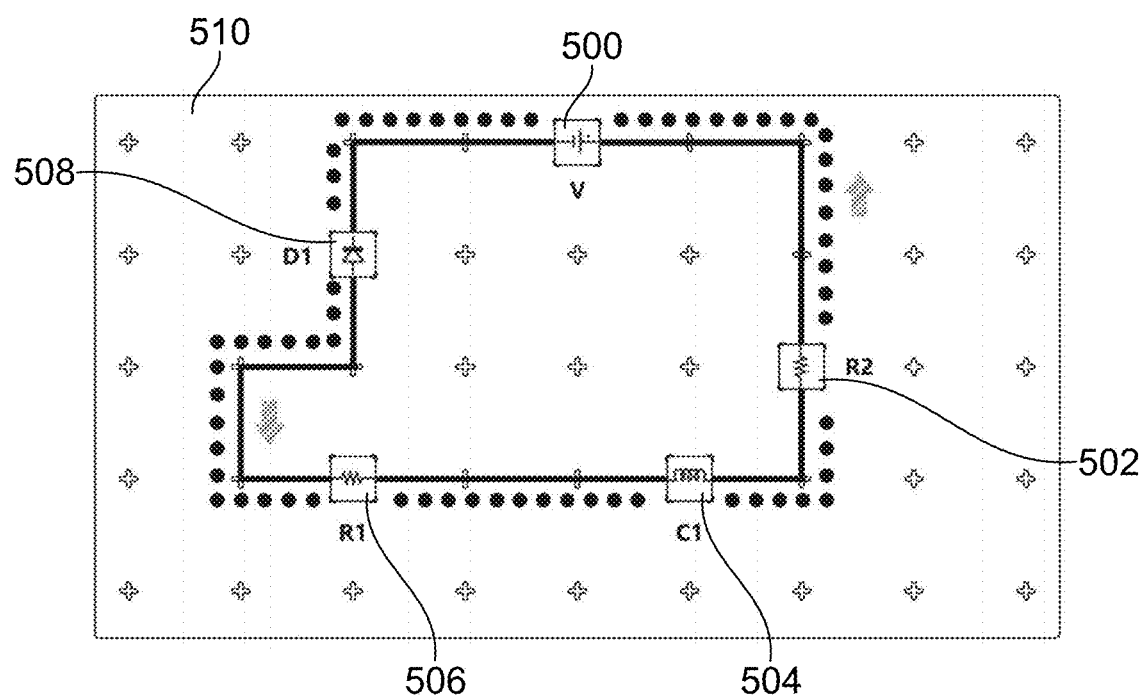
FIG. 21 is a front view showing physical components, in this case tile anchors, attached to an attachment panel forming part of a different embodiment of the simulation system to that shown in FIG. 1.

A alternative embodiment is depicted in FIG. 21. In this case, one or more tile anchors 500 to 508 are configured to simulate an electrical circuit element. In this case, a user selectable change to one or more electrical elements is identified by the controller. The controller determines a corresponding change to the electrical properties of the configuration of virtual components, and then applies a selected modelling template to the current arrangement of virtual components to generate a visualisation comprising an indication of an electrical effect associated with the user selected change.

For example, the user selected change may involve a replacement of one element for another, where each elements are representative of different resistance, capacitance, inductance and the like. Alternatively, the capture device 13 may be configured to detect the rotational position of a dial anchor, such as the dial anchor 140 shown in FIG. 4.

The user selected change may involve the rotation of the dial anchor 140 to increase or decrease a desired electrical property of a electrical circuit component corresponding to tile anchors 500 to 508. Accordingly, a change to one or more electrical properties of the configuration of virtual components can be determined at least in part according to the controller by receiving image data from the captured vice, determining a current position of an interaction device (e.g. dial anchor 140) coupled to an attachment panel 510 and then determining based on the current position of the interaction device the corresponding change to electrical properties of the configuration of virtual components.

The dial anchor 140 can be used in any a wide variety of situations. The dial anchor 140 is intended as device which can be docked anywhere on the assembly panel and whose function can be assigned and re-assigned according to a desired function in the context of that particular usage. Examples include: temperature control for a simulated fluid or gas, wind speed for a simulated flow over a user-made assembly of physical components, displays scale of projected physical behaviours (e.g. the display size of forces in the beams), the properties of electrical components (e.g. the resistance of a resistor or the voltage of a battery), the direction of solar radiation on a user-made assembly of physical components.

In one or more embodiments, the dial anchor features a finite number (e.g. 120) of 'click-to-rest' radial positions such that the dial can be rotated by the user and remains in place.

Figure 22:
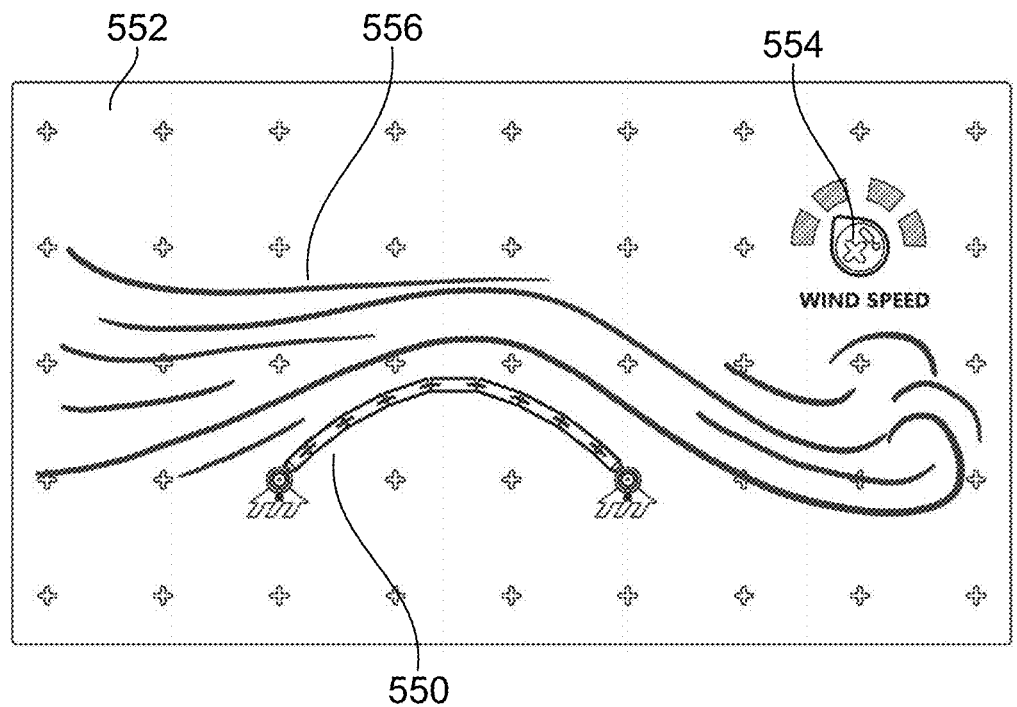
FIGS. 22 and 23 are front views showing physical components, including a dial anchor, attached to an attachment panel forming part of two further embodiments of the simulation system to that shown in FIG. 1.

A further embodiment of the invention is depicted in relation to FIG. 22, which shows an assembly 550 of structural components attached to an attachment panel 552. A dial anchor 554, identical to the dial anchor 140 shown in FIG. 4, is also attached to the attachment panel 552. Rather than a distortion being applied to the configuration of components by a user, for example using the wand 51, in this case the user can turn the dial anchor 554 to a position indicative of a desired wind speed impacting the assembly of elements 550. A visualisation 556 of a change to the behavioural properties of the assembly 550 caused by the increase or decrease in wind speed can be displayed by the visualisation 556. For example, a visualisation of the air turbulence or other physical effect associated with the change in wind speed may be displayed to a user.

Figure 23:
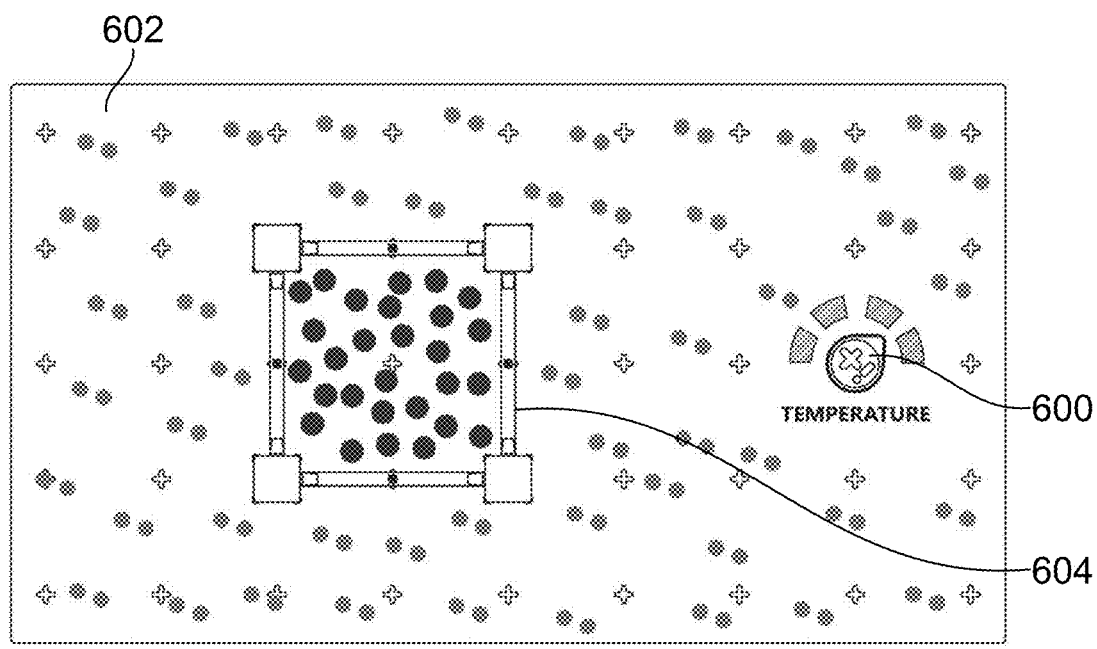

In yet another embodiment, as shown in FIG. 23, a dial anchor 600, identical to the dial anchor 140 shown in FIG. 4, may be attached to an attachment panel 602 in order for a user to physically interact with an assembly 604 of physical components attached to the attachment panel 602. In this example, a user may turn the dial anchor 604 to a desired position corresponding to a temperature. Based on the position of the dial anchor 600, the controller may determine a corresponding change to behavioural properties of the configuration of assembly 604. By way of example, the assembly 604 of physical components may simulate an enclosed system housing a gas. The physical effect associated with a user defined increase to the temperature of the gas within the assembly 64 may be a visualisation corresponding to an increase in heat, pressure or other physical effect associated with the change in temperature of the gas.

Figure 24:
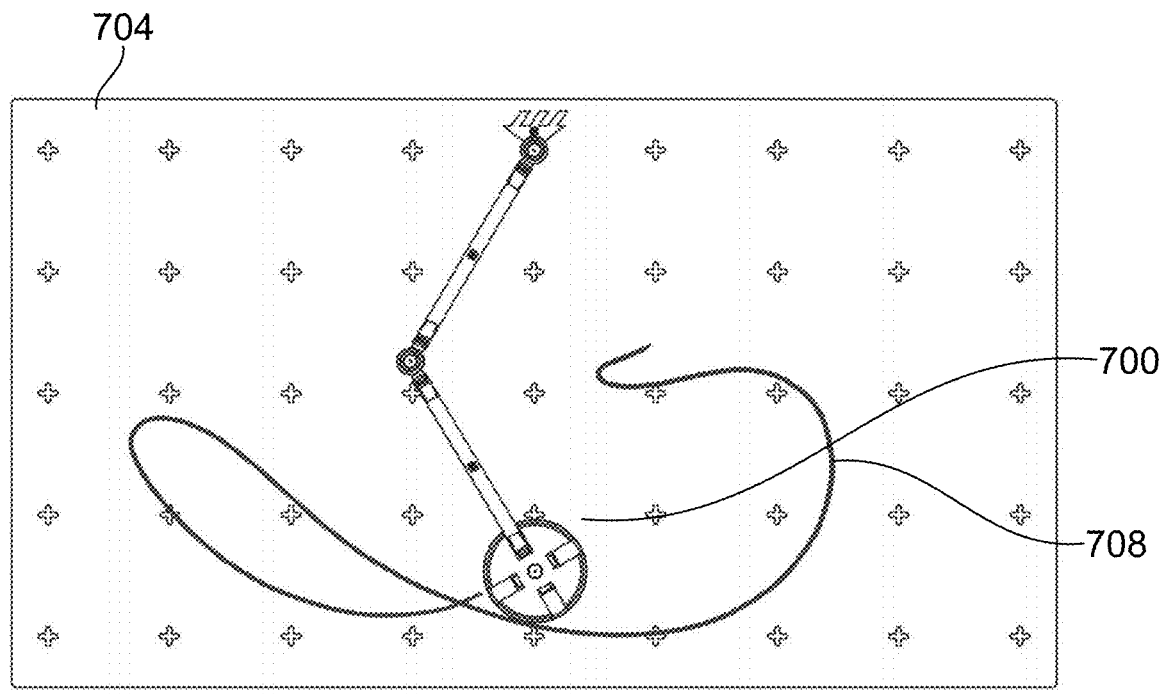
FIGS. 24 and 25 are front views showing show tracking beacons and attachment members respectively docked into apertures of attachment panels for use in one or more embodiments of the simulation system described herein.
Figure 25:
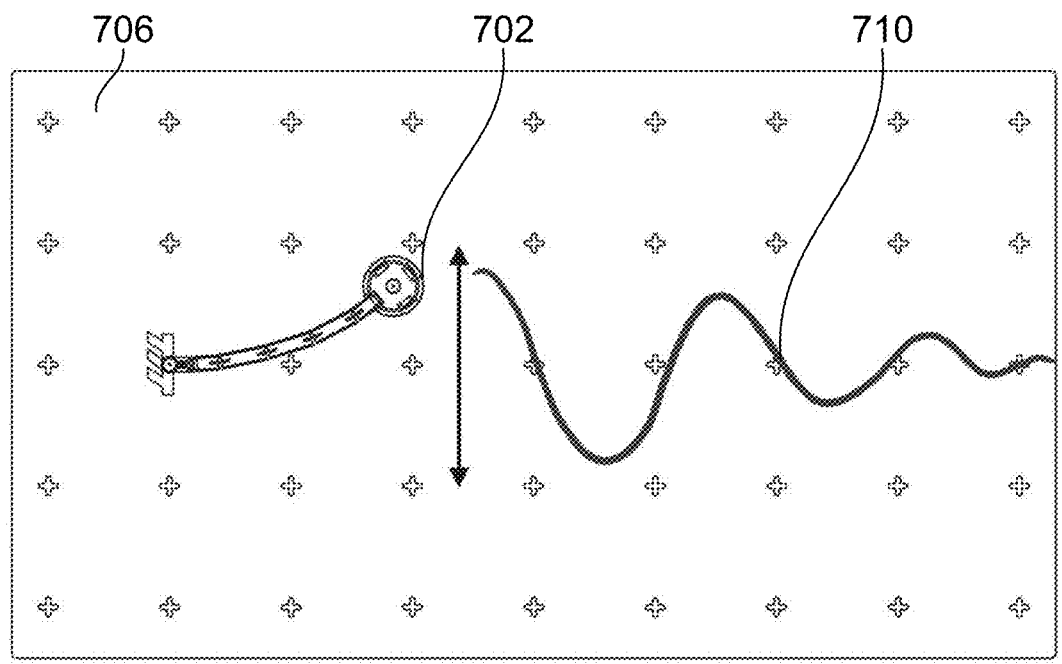

FIGS. 24 and 25 show tracking beacons 700 and 702 respectively docked into apertures of openings or apertures in one or more physical components. The tracking beacons 700 and 702 are tracked by the capture device 13 shown in FIG. 1 and the visualisations respectively of 708 and 710 depict a time-history path of the beacons position. This can be applied to any user-generated assembly but will be particularly effective for physics applications (such as the double pendulum shown in FIG. 30 or the oscillating mass shown in FIG. 31.

What is claimed is:

1. A simulation system comprising:
   a plurality of physical components, each corresponding to one of a plurality of physical component types,
   an attachment panel comprising an arrangement of attachment locations, such that one or more of the physical components are attachable to the attachment panel; a display system configured to provide a visualisation on or proximate one or both of the attachment panel and the plurality of physical components, wherein the attachment locations comprise recesses shaped such that, when a physical component is attached to an attachment location, it is prevented from rotating with respect to a plane of the attachment surface;
   a capture device configured to capture image data of a current status of the attachment panel and the plurality of physical components; and
   a controller configured, when at least one physical component is coupled to the attachment panel, to:
   a) determine a configuration of physical components one or more of which are coupled to the attachment panel;
   b) create a configuration of virtual components by assigning a virtual component for each physical component of the configuration of physical components;
   c) identify a user's physical interaction with the configuration of physical components and determine a corresponding change to behavioural properties of the configuration of virtual components, and further comprises identifying a distortion applied to the configuration of physical components and determine a corresponding distortion to the configuration of virtual components;
   d) apply a selected modelling template to the current arrangement of virtual components to generate a visualisation comprising an indication of a physical effect associated with the change to the behavioural properties, and further comprises applying the selected modelling template to the current arrangement of virtual components to generate a visualisation comprising an indication of a physical effect associated with the distortion; wherein the distortion to the configuration of virtual components is determined at least in part according to the controller:
   receiving image data from the capture device;
   determining a current position of an interaction device, wherein the interaction device is pressed against one or more physical components to cause a distortion to the configuration of physical components; and determining based on the current position of the interaction device the distortion to the configuration of virtual components, and
   e) cause the display system to display the visualisation.

2. A system according to claim 1, wherein at least one physical component corresponds to a structural member, and wherein the, or each, physical component is mechanically couplable to at least one other physical component.

3. A system according to claim 2, wherein the physical component is a linear part selected from a set comprising one or more of: a beam, strut, cable, rod and rope linear part.

4. A system according to claim 2, wherein the physical component is an anchored part selected from a set comprising one or more of: a pinned anchor, a rigid anchor, a pulley anchor, a tile anchor and a dial anchor.

5. A system according to claim 2, wherein the physical component is a joint part selected from a set comprising one or more of: a pinned anchor, a rigid anchor, a pulley anchor, a tile anchor and a dial anchor.

6. A system according to claim 2, wherein the physical component is a docking part selected from a set comprising one or more of: a connecting dock, a tile dock and a tracking beacon.

7. A system according to claim 1, wherein the distortion to the configuration of virtual components is determined at least in part according to the controller:
   receiving image data from the capture device;
   identifying distortions to the physical components based on analysing the received image data; and
   assigning an equivalent distortion to each respective virtual component.

8. A system according to claim 1, wherein the interaction device is a hand-held device.

9. A system according to claim 1, wherein the interaction device coupled to one or more interconnected support members, one support member being coupled to the attachment panel.

10. A system according to claim 1, wherein at least one physical component corresponds to an electrical circuit element.

11. A system according to claim 10, wherein the
    step c) comprises identifying a user-selected change to the at least one electrical circuit element and determining a corresponding change to electrical properties of the configuration of virtual components, and
    step d) comprises applying the selected modelling template to the current arrangement of virtual components to generate a visualisation comprising an indication of an electrical effect associated with the user-selected change.

12. A system according to claim 11, wherein the change to one or more electrical properties of the configuration of virtual components is determined at least in part according to the controller:
    receiving image data from the capture device;
    determining a current position of an interaction device coupled to the attachment panel; and
    determining based on the current position of the interaction device the corresponding change to electrical properties of to the configuration of virtual components.

13. A system according to claim 1, wherein the display system comprises a projector configured to project an image onto a front surface of the attachment panel.

14. A system according to claim 1, wherein the display system comprises an augmented reality headset to display an image of the visualisation to the user.

15. A system according to claim 1, wherein the capture device comprises an infrared sensor and/or an RGB sensor.

16. A system according to claim 1, wherein the controller is configured to identify individual physical components coupled to the attachment panel, and to record the determined type for each physical component.

17. A system according to claim 1, wherein the visualisation is generated in dependence on the component types, shape, and position of the current arrangement of physical components.

18. A system according to claim 1, wherein the attachment locations define a periodic rectangular array.

19. A method implemented by a controller for generating a visualisation onto one or both of an attachment panel and the plurality of physical components for a simulation, comprising the steps of:
   a) identifying a configuration of virtual components based on received image data, wherein the configuration of virtual components corresponds to a configuration of physical components, wherein each physical component is associated with a physical component type, wherein the physical components are arranged coupled to an attachment panel, and wherein the physical components comprise at least one physical component attachable to an attachment location of the attachment panel;
   b) identifying a user's physical interaction with the physical configuration of components and determining a corresponding change to behavioural properties of the configuration of virtual components;
   c) applying a selected modelling template to the current arrangement of virtual components, and further comprises identifying a distortion applied to the configuration of physical components and determine a corresponding distortion to the configuration of virtual components;
   d) generating a visualisation comprising an indication of a physical effect associated with the change to the behavioural properties; and e) causing the display system to display the visualisation, and further comprises applying the selected modelling template to the current arrangement of virtual components to generate a visualisation comprising an indication of a physical effect associated with the distortion, and wherein the distortion to the configuration of virtual components is determined at least in part according to the controller:
   receiving image data from the capture device;
   determining a current position of an interaction device, wherein the interaction device is pressed against one or more physical components to cause a distortion to the configuration of physical components; and
   determining based on the current position of the interaction device the distortion to the configuration of virtual components.

20. A method according to claim 19, wherein the distortion to the configuration of virtual components is determined at least in part according to the controller:
   receiving image data from the capture device;
   identifying distortions to the physical components based on analysing the received image data; and
   assigning an equivalent distortion to each respective virtual component.

21. A method according to claim 19, wherein the distortion to the configuration of virtual components is determined at least in part according to the controller:
   receiving image data from the capture device;
   determining a current position of an interaction device, wherein the interaction device is pressed against one or more physical components to cause a distortion to the configuration of physical components; and
   determining based on the current position of the interaction device the distortion to the configuration of virtual components.

22. A method according to claim 19, wherein at least one physical component corresponds to an electrical circuit element, and wherein
   step c) comprises identifying a user-selected change to one or more electrical circuit element and determine a corresponding change to electrical properties of the configuration of virtual components, and
   step d) comprises applying the selected modelling template to the current arrangement of virtual components to generate a visualisation comprising an indication of an electrical effect associated with the user-selected change.

23. A method according to claim 22, wherein the change to one or more electrical properties of the configuration of virtual components is determined at least in part according to the controller:
   receiving image data from the capture device;
   determining a current position of an interaction device coupled to the attachment panel; and
   determining based on the current position of the interaction device the corresponding change to electrical properties of to the configuration of virtual components.

* * * * *